US006475815B1

(12) United States Patent
Nambu et al.

(10) Patent No.: US 6,475,815 B1
(45) Date of Patent: Nov. 5, 2002

(54) METHOD OF MEASURING TEMPERATURE, METHOD OF TAKING SAMPLES FOR TEMPERATURE MEASUREMENT AND METHOD FOR FABRICATING SEMICONDUCTOR DEVICE

(75) Inventors: Yuko Nambu, Shiga; Satoshi Shibata, Toyama, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/456,381

(22) Filed: Dec. 8, 1999

(30) Foreign Application Priority Data

Dec. 9, 1998 (JP) ............................................. 10-350075

(51) Int. Cl.[7] .............................. H01L 21/66; C30B 1/02

(52) U.S. Cl. ................................ 438/16; 438/14; 117/8

(58) Field of Search ............................... 438/14, 16, 17, 438/18, 54, 7; 117/8, 10, 201

(56) References Cited

U.S. PATENT DOCUMENTS

| 4,203,799 A | * | 5/1980 | Sugawara et al. | ............ | 117/85 |
| 4,332,833 A | * | 6/1982 | Aspnes et al. | ................. | 427/8 |
| 4,434,025 A | * | 2/1984 | Robillard | ..................... | 117/86 |

(List continued on next page.)

FOREIGN PATENT DOCUMENTS

| JP | 5-249031 | 9/1993 |
| JP | 6-50880 | 2/1994 |
| WO | 90/10852 | 9/1990 |

OTHER PUBLICATIONS

Ozturk et al., "Optimization of the Germanium Preamorphization Conditions for Shallow–Junction Formation", IEEE Transactions on Electron Devices, May 1988, pp. 659–668.*

Kal et al., "Single crystal growth of Si–Ge alloy by ion implantation and sequential rapid thermal anneal", Electronic Letters, Feb. 3, 1994, pp. 272–274.*

(List continued on next page.)

*Primary Examiner*—Matthew Smith
*Assistant Examiner*—Lex H. Malsawma
(74) *Attorney, Agent, or Firm*—Nixon Peabody LLP; Donal R. Studebaker

(57) ABSTRACT

An amorphous region is formed by implanting an impurity such as As into a semiconductor substrate having a natural oxide film. The amorphous region is divided into a heavily doped oxygen region in which the concentration of oxygen is equal to or higher than a critical value and a lightly doped oxygen region in which the oxygen concentration is lower than the critical value. Then, oxygen ions are implanted to expand the heavily doped oxygen region throughout the amorphous region. Annealing is performed such that the reordering rate of the amorphous region is determined and the annealing temperature is determined by using the relationship between the annealing temperature and the reordering rate. By adjusting the oxygen concentration in the amorphous region to the critical value or more, the reordering rate can be adjusted to a nearly constant low value and the accuracy and reliability of temperature measurement is increased. By implanting ions of a IV group element, implanting ions under such a condition that the temperature of the substrate is lower than −10° C., or performing annealing at 300 to 450° C., a distinct boundary is provided between the amorphous region and a crystal region or the roughness of the interface therebetween is reduced so that the same effect is achieved.

37 Claims, 16 Drawing Sheets

U.S. PATENT DOCUMENTS

| | | | | |
|---|---|---|---|---|
| 4,647,207 A | * | 3/1987 | Bjork et al. | 356/369 |
| 4,786,608 A | * | 11/1988 | Griffith | 438/766 |
| 4,957,368 A | * | 9/1990 | Smith | 356/369 |
| 5,052,821 A | * | 10/1991 | Gisdakis et al. | 374/179 |
| 5,091,320 A | * | 2/1992 | Aspnes et al. | 427/8 |
| 5,232,547 A | * | 8/1993 | Drowley et al. | 117/55 |
| 5,277,747 A | * | 1/1994 | Aspnes | 427/8 |
| 5,313,044 A | * | 5/1994 | Massoud et al. | 219/121.85 |
| 5,314,831 A | * | 5/1994 | Hirae et al. | 117/8 |
| 5,494,697 A | * | 2/1996 | Blayo et al. | 427/10 |
| 5,501,637 A | * | 3/1996 | Duncan et al. | 374/126 |
| 5,564,830 A | * | 10/1996 | Bobel et al. | 374/126 |
| 5,624,190 A | * | 4/1997 | Joseph et al. | 374/161 |
| 5,684,301 A | * | 11/1997 | Cresswell et al. | 250/306 |
| 6,030,863 A | * | 2/2000 | Chang et al. | 438/229 |

OTHER PUBLICATIONS

Danzebrink et al., "Ellipsometric Measurements on Sngle–Crystal Silicon Spheres", Conference on Precision Electromagnetic Measurements Digest, Jul. 6–10, 1998, pp. 389–390.*

M. Fried et al., "Optical Properties of Thermally Stabilized Ion Implantation Amorphized Silicon", Proc. of Nuclear Instruments and Methods in Physics Research, B19/20 (1987), pp. 577–581.

B. Flamme, "Investigation of Amorphous Low–Pressure Chemical–Vapor–Deposited Silicon Films by Ellipsometry", Siemens Forsch.–u. Entwickl.–Ber. Bd. 10 (1981) Nr. 1, pp. 48–52.

B. Drevillon et al., "Ion Bombardment Effect on the Properties of a Si:H", (1985) Materials Research Society Symp. Proc., vol. 38, pp. 417–423.

* cited by examiner

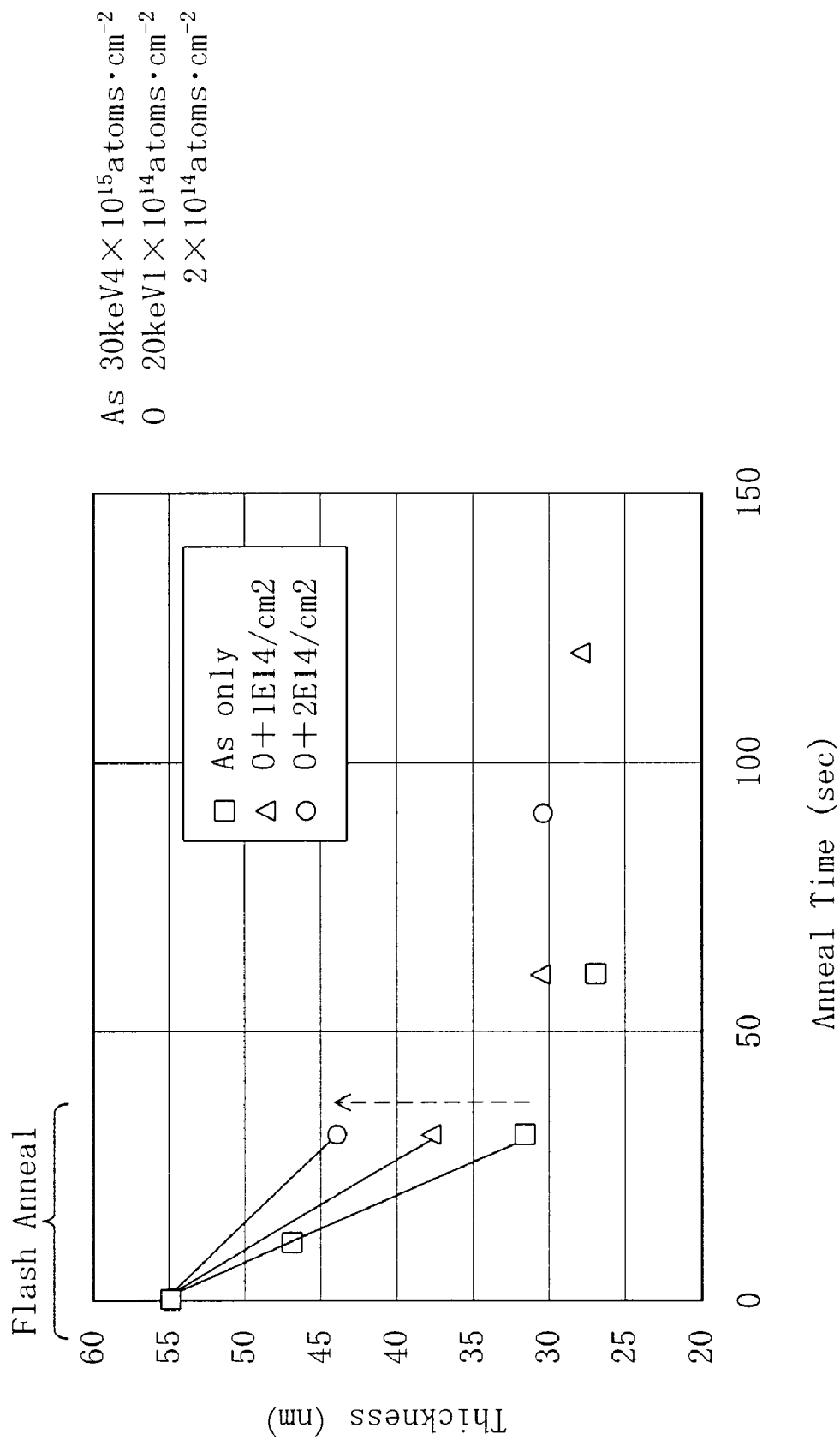

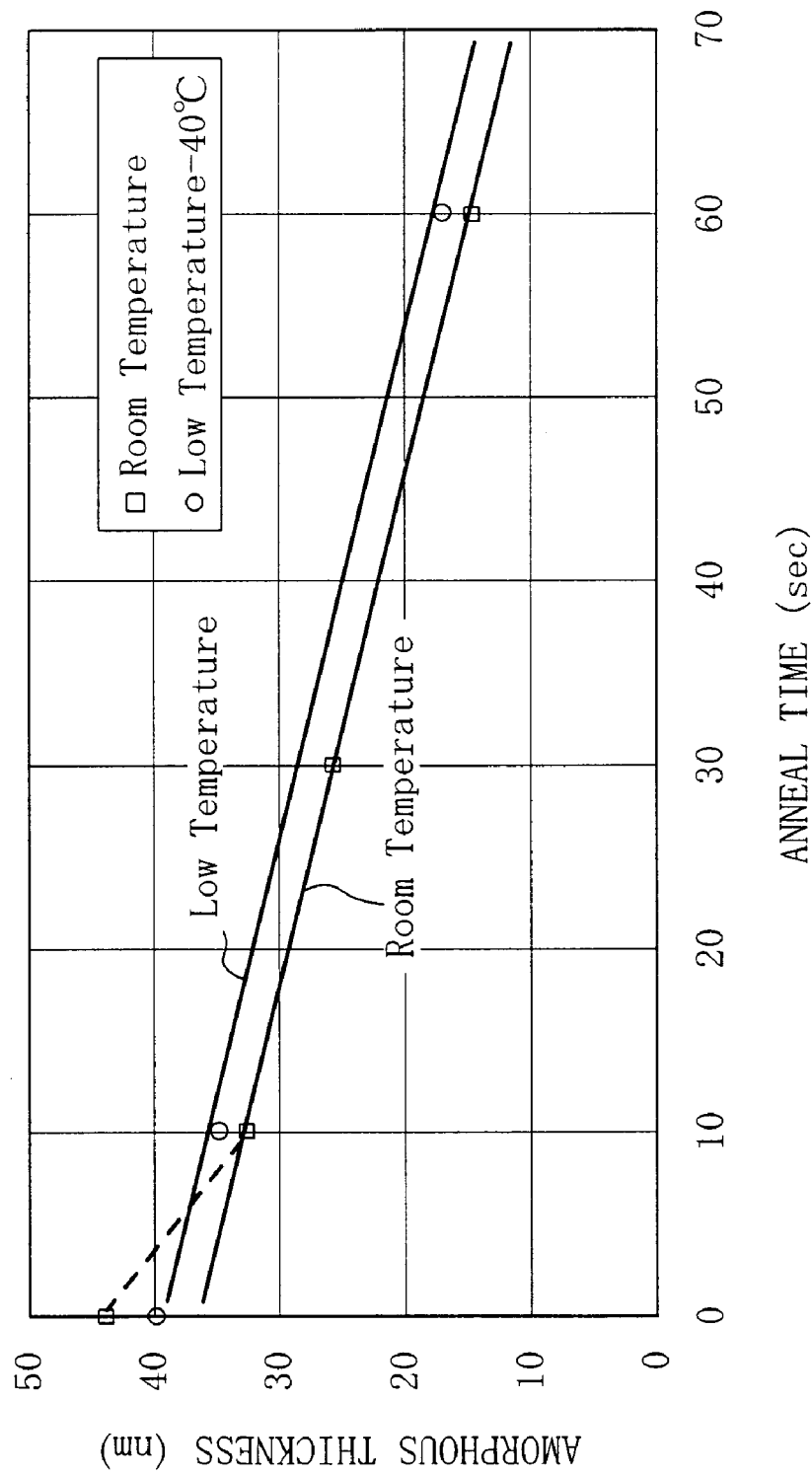

METHOD OF MEASURING TEMPERATURE, METHOD OF TAKING SAMPLES FOR TEMPERATURE MEASUREMENT AND METHOD FOR FABRICATING SEMICONDUCTOR DEVICE

BACKGROUND OF THE INVENTION

The present invention relates to a method of measuring a temperature and a temperature distribution in a specified region of a chamber, to a method of taking samples for temperature measurement, and to a method for fabricating a semiconductor device by using the method of measuring a temperature.

The fabrication of semiconductor devices includes such processes as CVD, ion implantation, heat treatment (annealing), and plasma etching whereby a film is formed on a wafer, an impurity is introduced into the wafer, a diffusion layer is formed by activating the impurity, and the film formed is patterned. These processes should be performed under proper conditions determined individually, among which is a temperature. In particular, a temperature at a certain portion of a wafer placed in a chamber and a temperature distribution over a surface of the wafer are important parameters in controlling such processes as CVD and heat treatment.

To measure a temperature and a temperature distribution during the individual fabrication processes, various methods have been adopted conventionally.

For example, a thermocouple is mounted on a chamber for performing an RTA process as a rapid thermal anneal process or on a back surface of a wafer (TC wafer). There is also known a method of measuring a temperature in a chamber by optical measurement using the detection of an IR ray.

However, the conventional methods of measuring a temperature have the following disadvantages.

In the temperature measurement method using the TC wafer, for example, the temperature of the top surface of the wafer is unknown though the temperature of the back surface of the wafer can be detected. In addition, a temperature range that can be measured is limited so that measurement accuracy reportedly deteriorates when a certain high temperature is reached (500 to 600° C. or more).

On the other hand, the optical measurement is also disadvantageous in that accurate temperature measurement cannot be performed because of optical noise or the like produced under the influence of a plasma. Moreover, a temperature distribution over a surface of a wafer cannot be measured by merely detecting temperature values at a limited number of points.

In particular, it is difficult to perform highly reliable measurement with respect to a temperature distribution over a surface of a wafer even by using the TC wafer.

SUMMARY OF THE INVENTION

A first object of the present invention is to perform temperature measurement by focusing attention on the fact that the anneal-induced reordering process of a portion changed by ion implantation from a monocrystalline state to an amorphous region is dependent on temperature and on conditions during implantation, measuring the thickness of the amorphous region by using spectro ellipsometry or the like, and calculating a temperature from the measured thickness and thereby increase the accuracy of temperature measurement.

The present inventors have found, in an attempt to increase the accuracy of temperature measurement by using spectro ellipsometry, a close correlation between a process for increasing the accuracy of temperature measurement and an improvement in the configuration of the amorphous region. A second object of the present invention is to improve, based on the finding, conditions during preamorphous implantation which is performed for preventing channeling or as one of preliminary processes for a silicidation process.

A first method of measuring a temperature according to the present invention comprises the steps of: (a) doping an amorphous region formed in a semiconductor region of a substrate with oxygen; (b) heating the amorphous region for a given time and determining a reordering rate at which the amorphous region is recrystallized; and (c) determining a temperature of the amorphous region in the step (b) based on a relationship between the reordering rate of the amorphous region and a heating temperature, which has been prepared in advance.

In accordance with the method, the reordering rate during the heating of the amorphous region can be adjusted by adjusting the concentration of oxygen and temperature measurement can be performed in a desired temperature range.

The step (a) includes doping the amorphous region with oxygen such that a concentration of oxygen reaches a critical value for holding the reordering rate in the step (b) nearly constant from the initiation of the heating. Accordingly, the determination of the reordering rate, i.e., temperature measurement is performed with ease and high reliability. In In the case where an oxide film is formed on the semiconductor region of the substrate before the step (a) is performed, the method may further comprise the step of forming, prior to the step (a), the amorphous region by implanting impurity ions into the semiconductor region.

In accordance with the method, the adverse effect of oxygen that has been knocked on by the implantation of impurity ions and entered the amorphous region can be circumvented.

Alternatively, the method further comprises the step of removing, prior to the process performed in the step (a), a natural oxide film on the semiconductor region therefrom under a reduced pressure and the step (a) is performed without exposing the substrate to an atmosphere and by holding the substrate under a reduced pressure after the step of removing the natural oxide film. Accordingly, the oxygen concentration can be adjusted reliably to a desired value.

The step (b) is performed by using spectro ellipsometric measurement of a thickness of the amorphous region, which enables in-line temperature measurement.

A second method of measuring a temperature according to the present invention comprises the steps of: (a) forming an amorphous region in a semiconductor region of a substrate by implanting therein ions of a IV group element; (b) heating the amorphous region for a given time and determining a reordering rate at which the amorphous region is recrystallized; and (c) determining a temperature of the amorphous region in the step (b) based on a relationship between the reordering rate of the amorphous region and a heating temperature, which has been prepared in advance.

In accordance with the method, the amorphous region can be formed without affecting the conductivity type of the semiconductor region.

The step (a) includes implanting Ge ions under such a condition that a dose is $1\times10^{15}$ atoms·cm$^{-2}$ or more, which provides a distinct boundary between the amorphous region and the crystal region in the semiconductor region and increases the accuracy and reliability of temperature measurement.

A third method of measuring a temperature according to the present invention comprises the steps of: (a) forming an amorphous region in a semiconductor region of a substrate by implanting therein ions of at least one of arsenic (As), phosphorus (P), a halogen element, and an inert gas element; (b) heating the amorphous region for a given time and determining a reordering rate at which the amorphous region is recrystallized; and (c) determining a temperature of the amorphous region in the step (b) based on a relationship between the reordering rate of the amorphous region and a heating temperature, which has been prepared in advance.

In accordance with the method, the accuracy and reliability of temperature measurement leading to an elongated maintenance period and a reduced number of semiconductor fabricating apparatus can be increased without using a corrosive gas such as $GeF_4$.

A fourth method of measuring a temperature according to the present invention comprises the steps of: (a) forming a plurality of amorphous regions in a plurality of portions of a semiconductor region of a substrate by implanting ions therein under different conditions; (b) heating the plurality of amorphous regions for a given time and individually determining respective reordering rates at which the amorphous regions are recrystallized; and (c) determining respective temperatures of the amorphous regions in the step (b) which correspond to the individual reordering rates based on relationships between the respective reordering rates of the amorphous regions and a heating temperature, which have been prepared in advance.

In accordance with the method, the range of measurable temperatures can be widened by using the different amorphous regions having different ranges of temperatures that can be measured with high reliability. In particular, even an unknown temperature can be detected.

Preferably, the step (a) includes implanting different ion species into the plurality of portions or implanting the ions into the plurality of portions under different conditions.

The substrate is in the form of a wafer and the step (a) is performed by using a sample having the four portions composed of four regions formed by vertically and horizontally dividing the wafer into four parts in two dimensions. Accordingly, even when the temperature in a certain process step is unknown, if only one type of ions are implanted later into the entire wafer, it becomes possible to perform detailed measurement of a temperature distribution or the like over a region at which the temperature was unknown and determined based on data on the reordering rates at the four portions.

A fifth method of measuring a temperature according to the present invention comprises the steps of: (a) forming a first amorphous region in a first semiconductor region located in a top surface of a substrate by implanting ions therein; (b) forming a second amorphous region in a second semiconductor region located in a back surface of the substrate by implanting ions therein; (c) heating the substrate under such conditions that the first amorphous region is reordered and the second amorphous region is not reordered and determining a reordering rate of the first amorphous region; and (d) determining a temperature of either one of the first and second amorphous regions in the step (c) based on a relationship between the reordering rate of the first amorphous region and a heating temperature, which has been prepared in advance.

In accordance with the method, if the temperature of the first amorphous region is measured and then the substrate is heated under such a condition that the second amorphous region is reordered, temperature measurement in the two regions having different temperatures can be performed by using the single substrate. In the case of using a wafer with an increased diameter, in particular, the thickness of the wafer is increased so that, even when the wafer is heated to a temperature at which the first amorphous region in the top surface of the wafer is reordered, the back surface thereof may not reach the temperature. By using the method of measuring a temperature, however, the number of samples for measurement can be reduced.

A sixth method of measuring a temperature according to the present invention comprises the steps of: (a) forming a first amorphous region in a first semiconductor region located in a top surface of a substrate by implanting ions therein; (b) forming a second amorphous region in a second semiconductor region located in a back surface of the substrate by implanting ions therein; (c) heating the substrate to reorder the first and second amorphous regions and determining respective reordering rates of the first and second amorphous regions; (d) determining respective temperatures of the first and second amorphous regions in the step (c) which correspond to the individual reordering rates based on relationships between the respective reordering rates of the first and second amorphous regions and a heating temperature, which have been prepared in advance; and (e) determining a heat conductivity of the substrate based on a temperature difference between the first and second amorphous regions.

Since the heat conductivity of the substrate can be determined, the method allows temperature control at each portion of the substrate and provides a product device with an improved quality and a higher yield. If the diameter of the wafer is increased, in particular, the thickness of the wafer is increased so that the process steps are controlled properly by determining the heat conductivity.

A seventh method of measuring a temperature according to the present invention comprises the steps of: (a) forming an amorphous region in a semiconductor region of a substrate by implanting ions therein under such a condition that a temperature of the substrate is lower than $-10°$ C.; (b) heating the amorphous region for a given time and determining a reordering rate at which the amorphous region is recrystallized; and (c) determining a temperature of the amorphous region in the step (b) based on a relationship between the reordering rate of the amorphous region and a heating temperature, which has been prepared in advance.

In accordance with the method, temperature measurement can be performed with a distinct boundary provided between the amorphous region and the crystal region in the semiconductor region or with the interface having reduced roughness. As a result, the accuracy and reliability of temperature measurement is increased.

An eighth method of measuring a temperature according to the present invention comprises the steps of: (a) forming an amorphous region in a semiconductor region of a substrate by implanting ions therein; (b) annealing the amorphous region at a temperature in the range of 300 to 450° C.; (c) heating the amorphous region and determining a reordering rate at which the amorphous region is recrystallized; and (d) determining a temperature of the amorphous region in the step (c) based on a relationship between the reordering rate of the amorphous region and a heating temperature, which has been prepared in advance.

In accordance with the method, temperature measurement can be performed with a distinct boundary provided between the amorphous region and the crystal region in the semiconductor region or with the interface having reduced roughness. As a result, the accuracy and reliability of temperature measurement is increased.

A first method of producing a sample for temperature measurement is performed by heating an amorphous region of a substrate f or a given time, determining a reordering rate at which the amorphous region is recrystallized, and thereby measuring a temperature of the amorphous region during the heating based on a relationship between the reordering rate of the amorphous region and a heating temperature, which has been prepared in advance, wherein the amorphous region formed in a semiconductor region of the substrate is doped with oxygen at a critical concentration for holding the reordering rate during the heating nearly constant from the initiation of the heating.

The method allows production of a sample which permits temperature measurement to be performed with accuracy and reliability by using a stable reordering rate of the amorphous region.

In the case where an oxide film is formed on the semiconductor region of the substrate prior to the doping of the amorphous region with oxygen, the amorphous region may be formed by implanting impurity ions into the semiconductor region from over the oxide film prior to the doping of the amorphous region with oxygen.

The method allows production of a sample which enables temperature measurement, while removing the adverse effect of oxygen that has been knocked on and entered the amorphous region.

Prior to the doping of the amorphous region with oxygen, a natural oxide film on the semiconductor region is removed therefrom under a reduced pressure and then the semiconductor region is doped with oxygen ions implanted therein. This provides a sample for specifying a temperature in which the oxygen concentration has been adjusted more precisely.

A second method of producing a sample for temperature measurement is performed by heating an amorphous region of a substrate for a given time, determining a reordering rate at which the amorphous region is recrystallized, and thereby measuring a temperature of the amorphous region during the heating based on a relationship between the reordering rate of the amorphous region and a heating temperature, which has been prepared in advance, wherein the amorphous region is formed in a semiconductor region of the substrate by implanting therein ions of a IV group element.

The method allows formation of a sample without affecting the conductivity type of the semiconductor region.

During the ion implantation, Ge ions are implanted under such a condition that a dose is $1 \times 10^{15}$ atoms$\cdot^{-2}$ or more, which provides a distinct boundary between the amorphous region and the crystal region in the semiconductor region and reduces the roughness of the interface. Consequently, a sample which allows temperature measurement with high accuracy and reliability can be formed.

A third method of producing a sample for temperature measurement is performed by heating an amorphous region of a substrate for a given time, determining a reordering rate at which the amorphous region is recrystallized, and thereby measuring a temperature of the amorphous region during the heating based on a relationship between the reordering rate of the amorphous region and a heating temperature, which has been prepared in advance, wherein the amorphous region is formed in a semiconductor region of the substrate by implanting therein ions of at least one of arsenic (As), phosphorus (P), a halogen element, and an inert gas element.

The method achieves the same effects as achieved by the second method of producing a sample for temperature measurement.

A fourth method of producing a sample for temperature measurement is performed by heating an amorphous region of a substrate for a given time, determining a reordering rate at which the amorphous region is recrystallized, and thereby measuring a temperature of the amorphous region during the heating based on a relationship between the reordering rate of the amorphous region and a heating temperature, which has been prepared in advance, wherein a plurality of amorphous regions are formed in a plurality of portions of a semiconductor region of the substrate by implanting ions therein under different conditions.

The method allows formation of a sample which permits a wide range of temperatures to be measured, as described above.

During the ion implantation, different ion species are preferably implanted into the plurality of portions.

Alternatively, the substrate is in the form of a wafer and the four portions may be composed of four regions formed by vertically and horizontally dividing the wafer into four parts in two dimensions.

A fifth method of producing a sample for temperature measurement is performed by heating an amorphous region of a substrate for a given time, determining a reordering rate at which the amorphous region is recrystallized, and thereby measuring a temperature of the amorphous region during the heating based on a relationship between the reordering rate of the amorphous region and a heating temperature, which has been prepared in advance, the method comprising the steps of: (a) forming a first amorphous region in a first semiconductor region located in a top surface of the substrate by implanting ions therein; and (b) forming a second amorphous region in a second semiconductor region located in a back surface of the substrate by implanting ions therein.

The method allows production of a sample which permits two temperature measurements to be performed by the foregoing action.

A sixth method of producing a sample for temperature measurement is performed by heating an amorphous region of a substrate for a given time, determining a reordering rate at which the amorphous region is recrystallized, and thereby measuring a temperature of the amorphous region during the heating based on a relationship between the reordering rate of the amorphous region and a heating temperature, which has been prepared in advance, the method comprising the steps of: (a) forming a first amorphous region in a first semiconductor region located in a top surface of the substrate by implanting ions therein; and (b) forming a second amorphous region in a second semiconductor region located in a back surface of the substrate by implanting ions therein, wherein when respective temperatures of the first and second amorphous regions are measured, a sample which allows a heat conductivity of the substrate to be determined based on a temperature difference between the first and second amorphous regions is formed.

The method allows formation of a sample that can be subjected to temperature control for increasing a production yield in the fabrication process, which is particularly important when the thickness of the sample increases as the diameter of the wafer increases.

A seventh method of producing a sample for temperature measurement is performed by heating an amorphous region of a substrate for a given time, determining a reordering rate at which the amorphous region is recrystallized, and thereby measuring a temperature of the amorphous region during the heating based on a relationship between the reordering rate of the amorphous region and a heating temperature, which has been prepared in advance, wherein the amorphous region is formed in a semiconductor region of the substrate by implanting ions therein under such a condition that a temperature of the substrate is lower than −10° C.

The method provides a distinct boundary between the amorphous region and the crystal region in the semiconductor region or the interface with reduced roughness. As a result, there can be produced a sample which permits temperature measurement to be performed with high accuracy and reliability.

An eighth method of producing a sample for temperature measurement is performed by heating an amorphous region of a substrate for a given time, determining a reordering rate at which the amorphous region is recrystallized, and thereby measuring a temperature of the amorphous region during the heating based on a relationship between the reordering rate of the amorphous region and a heating temperature, which has been prepared in advance, the method comprising the steps of: (a) forming the amorphous region in a semiconductor region of the substrate by implanting ions therein; and (b) annealing the amorphous region at a temperature in the range of 300 to 450° C.

The method provides a distinct boundary between the amorphous region and the crystal region in the semiconductor region or the interface with reduced roughness. As a result, there can be produced a sample which permits temperature measurement to be performed with high accuracy and reliability.

A first method for fabricating a semiconductor device according to the present invention is a method for fabricating a semiconductor device in a semiconductor region of a substrate, the method comprising a preamorphous step of forming an amorphous region in the semiconductor region by implanting therein ions of a IV group element, wherein after the preamorphous step, at least one of the step of implanting boron ions into the amorphous region and the step of siliciding the amorphous region is performed.

In accordance with the method, the boron implantation step or the silicidation step is performed after the formation of the amorphous region without affecting the conductivity type of the semiconductor region. The method allows a shallow diffusion layer to be formed by preventing channeling and a silicide layer to be formed with excellent smoothness.

During the ion implantation, Ge ions are implanted under such a condition that a dose is $1\times10^{15}$ atoms·cm$^{-2}$ or more.

A second method for fabricating a semiconductor device according to the present invention is a method for fabricating a semiconductor device in a semiconductor region of a substrate, the method comprising a preamorphous step of forming an amorphous region in the semiconductor region by implanting therein ions of at least one of arsenic (As), phosphorus (P), a halogen element, and an inert gas element, wherein after the preamorphous step, at least one of the step of implanting boron ions into the amorphous region and the step of siliciding the amorphous region is performed.

The method allows a shallow diffusion layer to be formed by preventing channeling and a silicide layer to be formed with excellent smoothness without using a corrosive GeF$_4$.

A third method for fabricating a semiconductor device according to the present invention is a method for fabricating a semiconductor device in a semiconductor region of a substrate, the method comprising a preamorphous step of forming an amorphous region in the semiconductor region by implanting ions therein under such a condition that a temperature of the substrate is lower than −10°C., wherein after the preamorphous step, at least one of the step of implanting boron ions into the amorphous region and the step of siliciding the amorphous region is performed.

In accordance with the method, the ion implantation step or the silicidation step is performed with a distinct boundary provided between the amorphous region and the crystal region in the semiconductor region. As a result, a shallow diffusion layer can be formed by preventing channeling and a silicide layer can be formed with excellent smoothness.

A fourth method for fabricating a semiconductor device according to the present invention is a method for fabricating a semiconductor device in a semiconductor region of a substrate, the method comprising a preamorphous step of forming an amorphous region in the semiconductor region by implanting ions therein and annealing the amorphous region at a temperature in the range of 300 to 450° C., wherein after the preamorphous step, at least one of the step of implanting boron ions into the amorphous region and the step of siliciding the amorphous region is performed.

In accordance with the method, the ion implantation step or the silicidation step is performed with a distinct boundary provided between the amorphous region and the crystal region in the semiconductor region. As a result, a shallow diffusion layer can be formed by preventing channeling and a silicide layer can be formed with excellent smoothness.

A fifth method for fabricating a semiconductor device according to the present invention is a method for fabricating a semiconductor device in a semiconductor region of a substrate, the method comprising the steps of: forming a first amorphous region in a first semiconductor region located in a top surface of the substrate by implanting ions therein and forming a second amorphous region in a second semiconductor region located in a back surface of the substrate by implanting ions therein; and determining, in a process of heating the first and second amorphous regions, respective temperatures of the first and second amorphous regions based on respective reordering rates of the first and second amorphous regions, determining a heat conductivity of the substrate based on a temperature difference between the first and second amorphous regions, and controlling the respective temperatures of the first and second amorphous regions of the substrate.

The method allows strict temperature control in the individual process steps and provides the relationship between temperature and the thickness of a wafer having an increasingly larger diameter. As a result, there can be fabricated a semiconductor device with a high quality and an increased production yield.

BRIEF DESCRIPTION OF THE DRAWINGS

FIG. 3 shows the result of measuring reordering rates when oxygen is implanted in a plurality of varying doses in the amorphous region;

FIG. 14 shows a reordering rate in an amorphous region formed by ion implantation at a low temperature;

DETAILED DESCRIPTION OF THE INVENTION

Principle of Temperature Measurement Using Reordering Rate of Amorphous Region

As disclosed in International Application No. PCT/JP98/02567 (International Publication No. WO98/57146), the present inventors have evaluated by spectro ellipsometry the process in which a semiconductor region that has been amorphized with impurity ions implanted therein (amorphous region) is reordered by annealing and found that the thickness of the amorphous region can be detected by an in-line non-destructive inspection. The present inventors have also found that, since a reordering rate which is a decrement in the film thickness of the amorphous region per unit time is dependent on an annealing temperature, an actual temperature on a surface of a wafer (top surface or back surface of the wafer) and a temperature distribution thereover can be detected by determining the reordering rate. In short, the present inventors have proved that the in-line non-destructive inspection allows the temperature on the surface of the wafer to be evaluated by spectro ellipsometry.

The present inventors have also found by the following experiment that, to increase the accuracy of temperature measurement based on the technology disclosed in International Application No. PCT/JP98/02567, proper adjustment of the concentration of oxygen in the amorphous region, including the reduction of oxygen implanted by the foregoing knock-on effect, is effective. In increasing the accuracy of temperature measurement in accordance with the present invention, however, measurement of the thickness of the amorphous region by spectro ellipsometry need not necessarily be used. There can be used other methods of measuring the thickness of the amorphous region, such as a destructive inspection by TEM observation.

Figure 1:
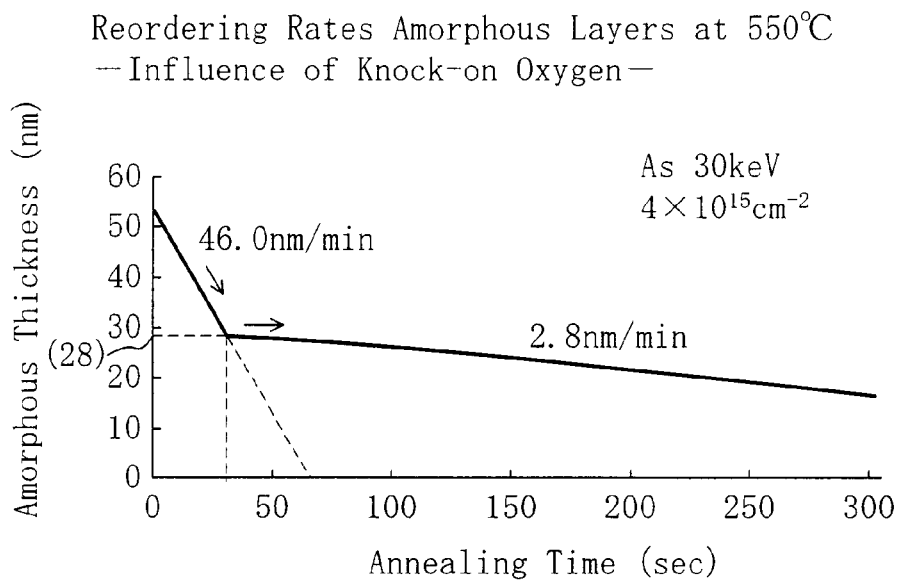
FIG. 1 shows a time-varying thickness of an amorphous region when it is annealed at 550° C., i.e., a reordering rate.

FIG. 1 shows a time-varying thickness of an amorphous region when the amorphous region formed by implanting arsenic ions (As) ions into a silicon substrate at a room temperature with an acceleration voltage of 30 keV and a dose of $4 \times 10^{15}$ cm$^{-2}$ is annealed at 550° C., i.e., a reordering rate. In FIG. 1, the horizontal axis represents an annealing time (sec) and the vertical axis represents the thickness of the amorphous region. As a result of TEM observation, the thickness of the amorphous region in this sample was determined to be 55 nm. Since the rate at which the amorphous region is reordered by annealing is a decrement in the thickness of the amorphous region per unit time (nm/min), the inclination of the varying line shown in FIG. 1 represents the reordering rate. As shown in FIG. 1, it was found that the reordering rate when the thickness of the amorphous region decreased from the initial value of 55 nm to 28 nm was 46.0 (nm/min) and the reordering rate when the thickness of the amorphous region decreased from 28 nm toward 0 nm was 2.8 (nm/min) At this stage, the present inventors suspected that the presence of oxygen was related to an abrupt change in reordering rate which was observed at a certain time point and thereafter and measured the concentration profile of oxygen in the silicon substrate.

Figure 2:
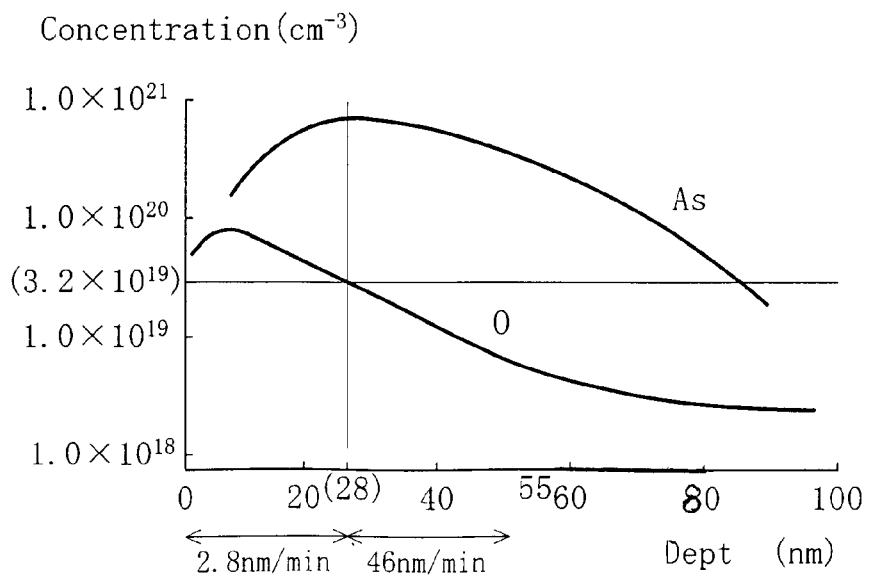
FIG. 2 shows the concentration profiles of arsenic (As) and oxygen (O) in the direction of depth of an As-implanted silicon substrate.

FIG. 2 shows the concentration profiles of arsenic (As) and oxygen (O) in the direction of depth of an As-implanted silicon substrate. As shown in the drawing, the oxygen concentration which should be equal by nature has a peak value close to $1 \times 10^{20}$ atoms·cm$^{-3}$ in a region near the top surface of the silicon substrate and gradually decreases in the direction of depth of the silicon substrate. If a consideration is given to the fact that only oxygen at about $2.0 \times 10^{20}$ atoms·cm$^{-3}$ is contained in the wafer, the presence of oxygen at a high concentration as shown in FIG. 2 may be attributed to the entrance of oxygen atoms knocked on by arsenic ions implanted into the silicon substrate. Specifically, a surface of the silicon substrate is cleaned by RCA cleaning or the like prior to the implantation of arsenic ions and, after the RCA cleaning, a natural oxide film is formed on the surface of the silicon substrate that has been exposed to an atmosphere. It can be considered that oxygen in the natural oxide film has been knocked on by the arsenic ions. The oxygen concentration at the point at which the reordering rate changed (at the point at which the thickness of the amorphous region was 28 nm) was about $3.2 \times 10^{19}$ atoms·cm$^{-3}$.

To examine the correlation between the oxygen concentration and the reordering rate, therefore, the reordering rate was measured by increasing the amount of implanted oxygen, as shown in FIG. 3. In FIG. 3, the horizontal axis represents an annealing time (sec) and the vertical axis represents the thickness of the amorphous region. FIG. 3 shows the results of measurement performed with respect to a sample in which only As ions were implanted at an acceleration voltage of 30 keV and a dose of $4 \times 10^{15}$ atoms·cm$^{-3}$ (data indicated by the mark □), a sample in which, in addition to As ions, oxygen ions were implanted at an acceleration voltage of 20 keV and a dose of $1 \times 10^{14}$ atoms·cm$^{-3}$ (data indicated by the mark ∆), and a sample in which, in addition to As ions, oxygen ions were implanted at an acceleration voltage of 20 keV and a dose of $2 \times 10^{14}$ atoms·cm$^{-3}$ (data indicated by the mark ○). As shown in the drawing, it was found that the reordering rate decreased as the oxygen concentration increased when a flash anneal (an annealing process in which temperature varies with time and a retention time at a peak temperature is nearly zero) was performed with respect to the amorphous region. In any of the three samples, the reordering rate changed at a certain thickness (thickness of 28 nm shown in FIG. 1) of the amorphous region and the oxygen concentration at a portion corresponding to the thickness of the amorphous region was close to $3.2 \times 10^{19}$ atoms·cm$^{-3}$.

As shown in FIG. 3, since the inclination of the rate at which the amorphous region is reordered by the flash anneal decreases gradually as the oxygen concentration increases, it is expected that the portion at which the reordering rate changes (thickness of 28 nm shown in FIG. 1) finally moves upward to reach the point at which the annealing time is zero. In short, it is sufficient for the point at which the oxygen concentration is $3.2 \times 10^{19}$ atoms·cm$^{-3}$ where the reordering rate changes to be at the point at which the thickness is 55 nm shown in FIG. 1. In other words, it was assumed that the reordering rate was low and constant when the entire amorphous region had been doped with oxygen at a concentration of $3.2 \times 10^{19}$ atoms·cm$^{-3}$ or more.

Since a reduction in reordering rate during annealing means a reduced influence of an error of annealing time on a variation in the amount of recovery in the amorphous region, the accuracy of temperature measurement is increased. Hereinafter, a description will be given to a first embodiment which verifies the assumption.

Embodiment 1

FIGS. 4(a) to 4(d) are cross-sectional views illustrating the procedure of an annealing process for temperature measurement in a first embodiment of the present invention. FIG. 5 is a flow chart illustrating the procedure for annealing and temperature measurement. In accordance with the flow chart of FIG. 5, the procedure of annealing in the present embodiment will be described with reference to FIGS. 4(a) to 4(d).

First, in Step ST11, RCA cleaning is performed with respect to a silicon substrate 10. Although a surface of the silicon substrate 10 is cleaned by the process, a silicon oxide film 11 which is a natural oxide film with a thickness of about 1 nm is formed on the surface of the silicon substrate 10.

Next, in Step ST12, arsenic ions (As) are implanted from over the silicon oxide film 11 at a room temperature with an acceleration voltage of 30 keV and a dose of $4 \times 10^{15}$ cm$^{-2}$. By the ion implantation process, the silicon substrate 10 is divided into an amorphous region 10a with disturbed crystallinity and a crystal region 10b underlying the amorphous region 10a which retains crystallinity unaffected by the implantation of arsenic ions, as shown in the cross-sectional view of FIG. 4(b). As described above, oxygen contained in the silicon oxide film is knocked on by arsenic ions as the implantation of arsenic ions proceeds and introduced into the substrate. The concentration of oxygen that has been knocked on becomes progressively lower with approach toward the bottom of the substrate. It has been proved, as stated previously, that the oxygen concentration has a critical value at which the reordering rate changes during annealing ($3.2 \times 10^{19}$ atoms·cm$^{-3}$). Under such conditions, the amorphous region 10a is subdivided into a highly doped oxygen region 10a located immediately under the silicon oxide film 11 and containing oxygen at a relatively high concentration equal to or higher than the critical value and a lightly doped oxygen region 10ab located immediately under the highly doped oxygen region 10aa and containing oxygen at a relatively low concentration lower than the critical value.

Figure 4A:
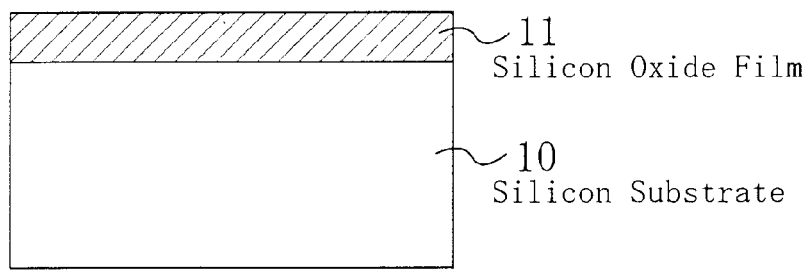
FIGS. 4(a) to 4(d) are cross-sectional views illustrating the procedure of an annealing process for temperature measurement in a first embodiment of the present invention.
Figure 4B:
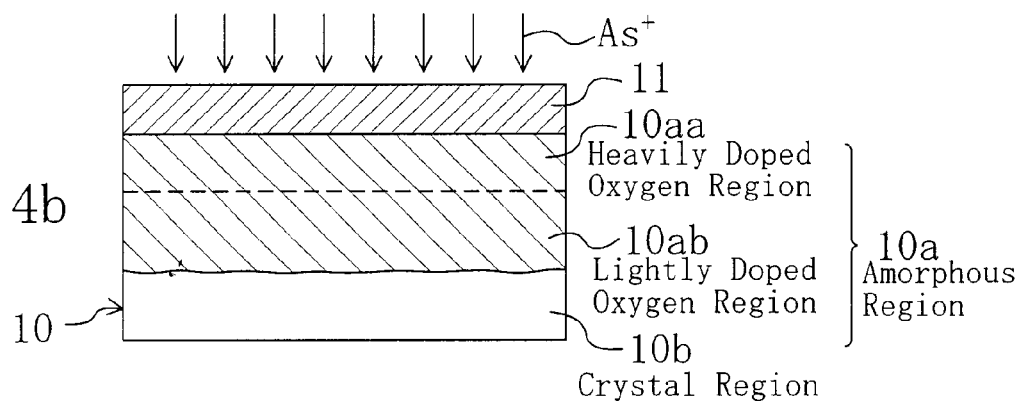
Figure 4C:
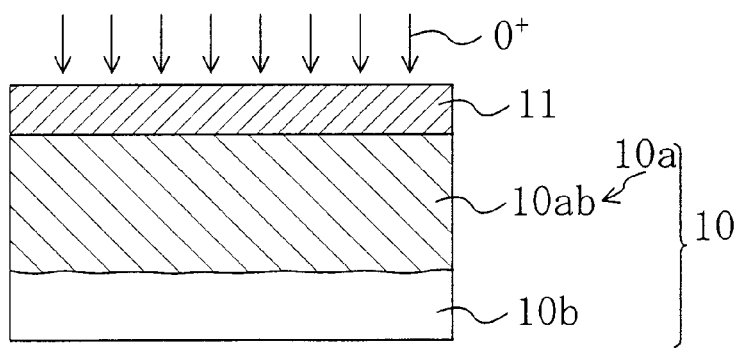
Figure 5:
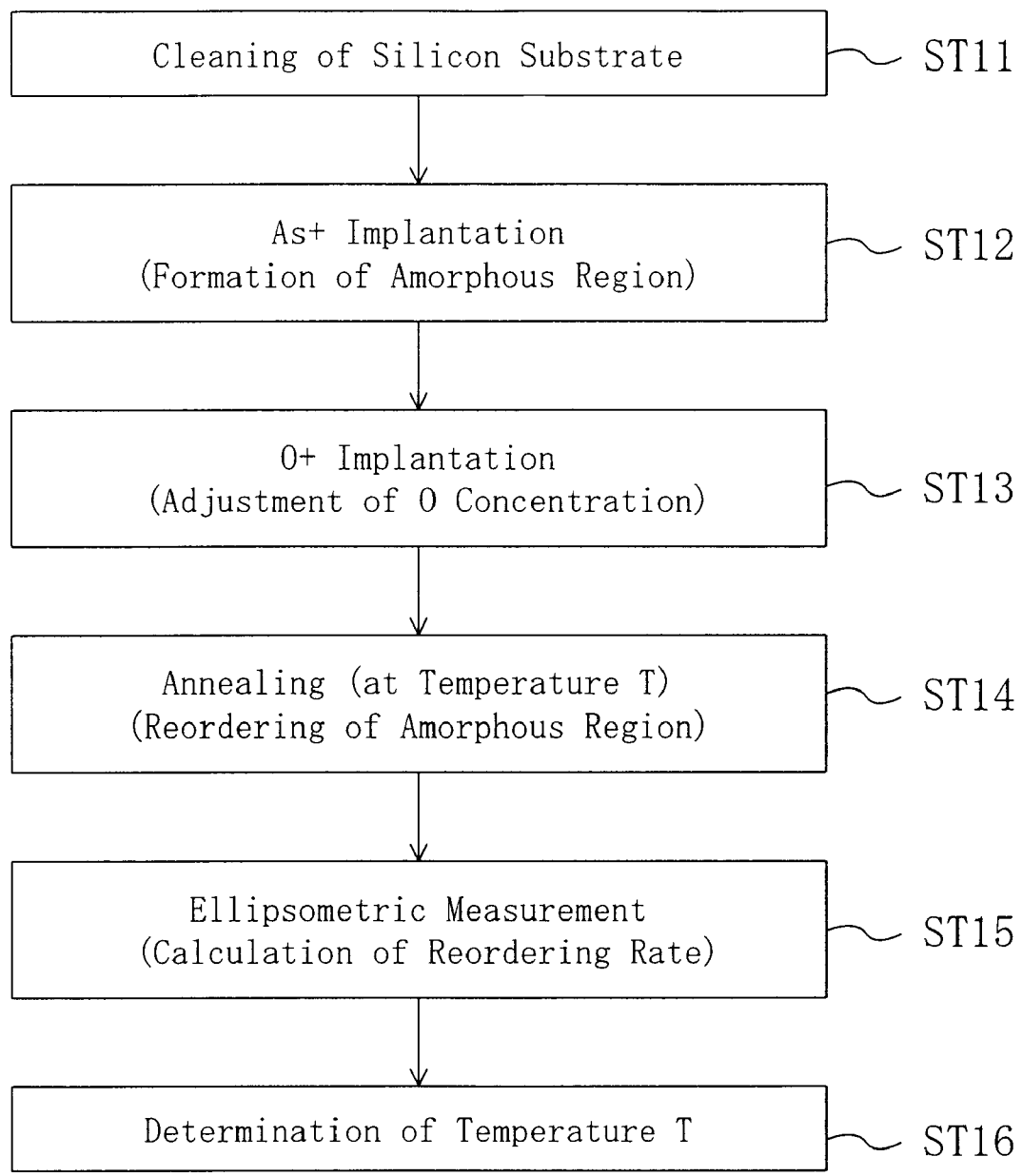
FIG. 5 is a flow chart illustrating the procedure of annealing and temperature measurement in the first embodiment.

Next, in Step ST13, oxygen ions are implanted to adjust the oxygen concentration in the lightly doped oxygen region 10ab (region located at a depth of 28 nm to 55 nm from the top surface of the silicon substrate 10) shown in FIG. 4(b) to the critical value ($3.2 \times 10^{19}$ atoms·cm$^{-3}$) or higher. At this time, the oxygen ions are implanted, e.g., at a room temperature with an acceleration voltage of 20 keV and a dose of $2 \times 10^{14}$ atoms·cm$^{-3}$ or more. By the implantation of oxygen ions, the heavily doped oxygen region 10aa is expanded to occupy the entire amorphous region 10a, as shown in FIG. 4(c).

Figure 4D:
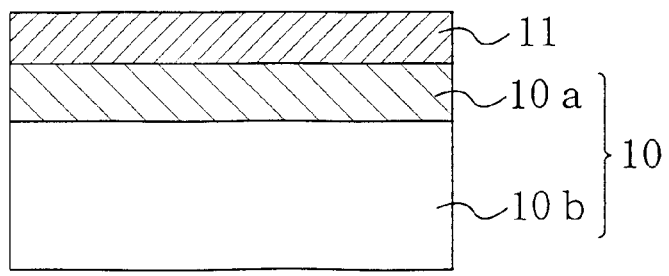

Next, in Step ST14, annealing is performed at a temperature T, whereby recrystallization proceeds from a portion of the amorphous region 10a in contact with the crystal region 10b, as shown in FIG. 4(d), so that the thickness of the amorphous region 10a in the silicon substrate 10 is reduced and the crystal region 10b is expanded upwardly.

Next, in Step ST15, a variation in the thickness of the amorphous region 10a within a given annealing time is detected by using a spectro ellipsometric apparatus such that a reordering rate is determined by dividing the thickness variation by the annealing time.

Figure 6:
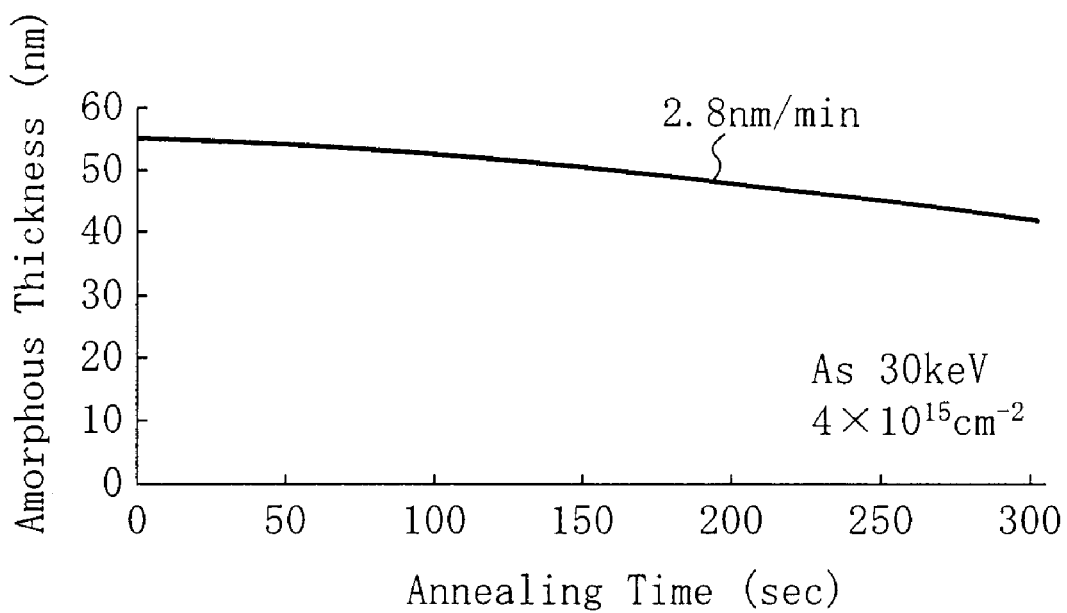
FIG. 6 shows a reordering rate at which the amorphous region is reordered to a crystal in the first embodiment.

FIG. 6 shows the rate at which the amorphous region 10a was reordered to the crystal. In the drawing, the horizontal axis represents an annealing time (sec) and the vertical axis represents the thickness (nm) of the amorphous. The thickness of the amorphous region 10a was measured by using a spectro ellipsometric apparatus, which will be described later. As shown in the drawing, the thickness of the amorphous region decreases nearly linearly against the lapse of the annealing time and the reordering rate was determined to be about 2.8 nm/min based on the inclination thereof. The data was obtained by performing implantation of As ions under the same conditions used for the sample shown in FIG. 1, performing implantation of oxygen ions for increasing the oxygen concentration, and performing annealing at 550° C. under the same conditions as used to obtain the data shown in FIG. 1. By thus adjusting the oxygen concentration in the amorphous region to a certain critical value or more, the reordering rate of the amorphous region can be adjusted to a nearly constant low value.

Next, in Step ST16, the annealing temperature T is determined based on the reordering rate determined in Step ST15 with reference to the relationship between the reordering rate and the annealing temperature T which has been prepared in advance. To determine the annealing temperature T in the Step ST16, it is necessary to have preliminarily found the dependence of the reordering rate on the annealing temperature, i.e., the relationship between the reordering rate and the annealing temperature T. A detailed description will be given to the calculation of the reordering rate and the determination of the annealing time T in Steps ST15 and ST16.

Figure 7:
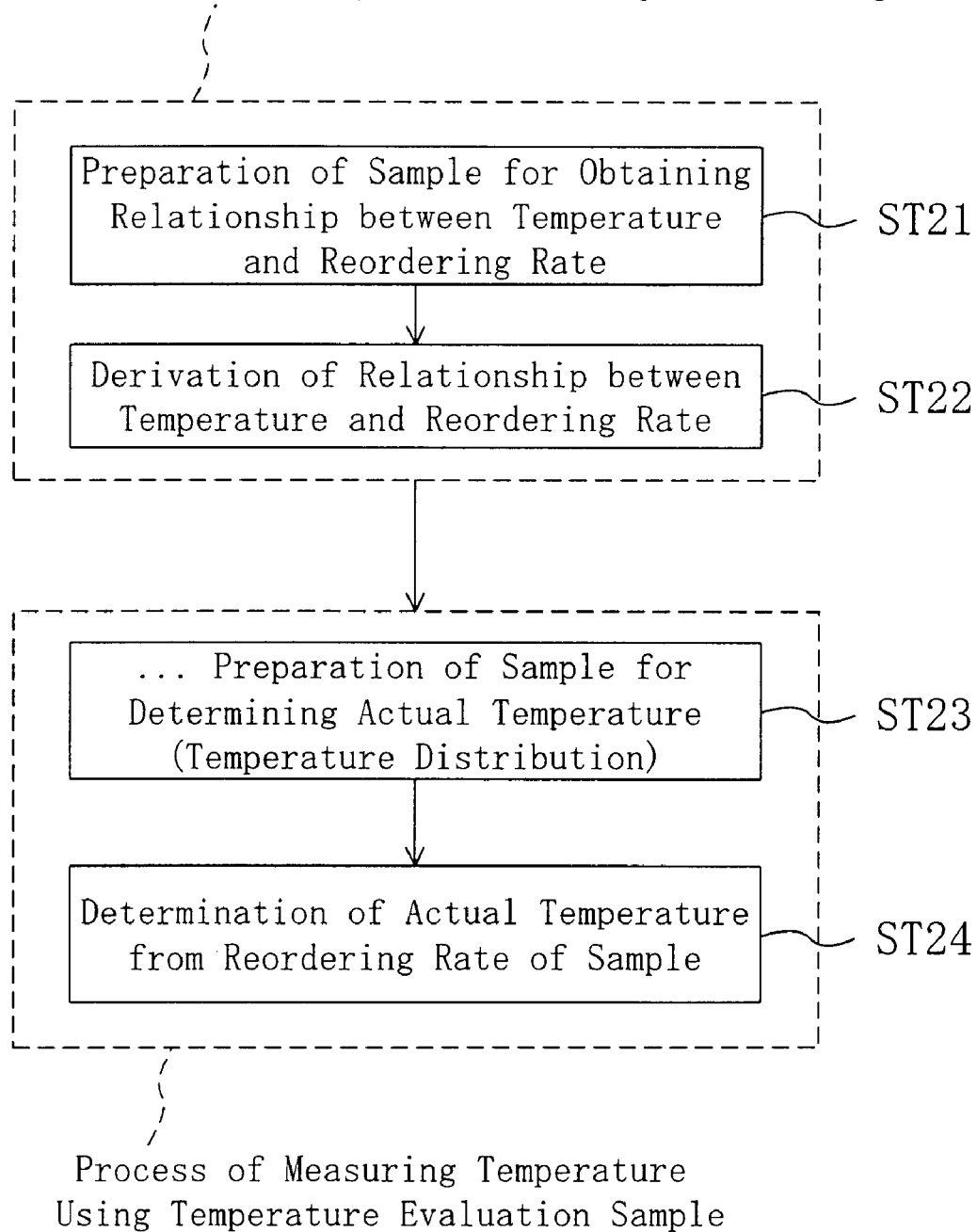
FIG. 7 is a flow chart illustrating the procedure of determining a temperature based on the relationship between annealing temperature and reordering rate in the first embodiment.
Figure 8:
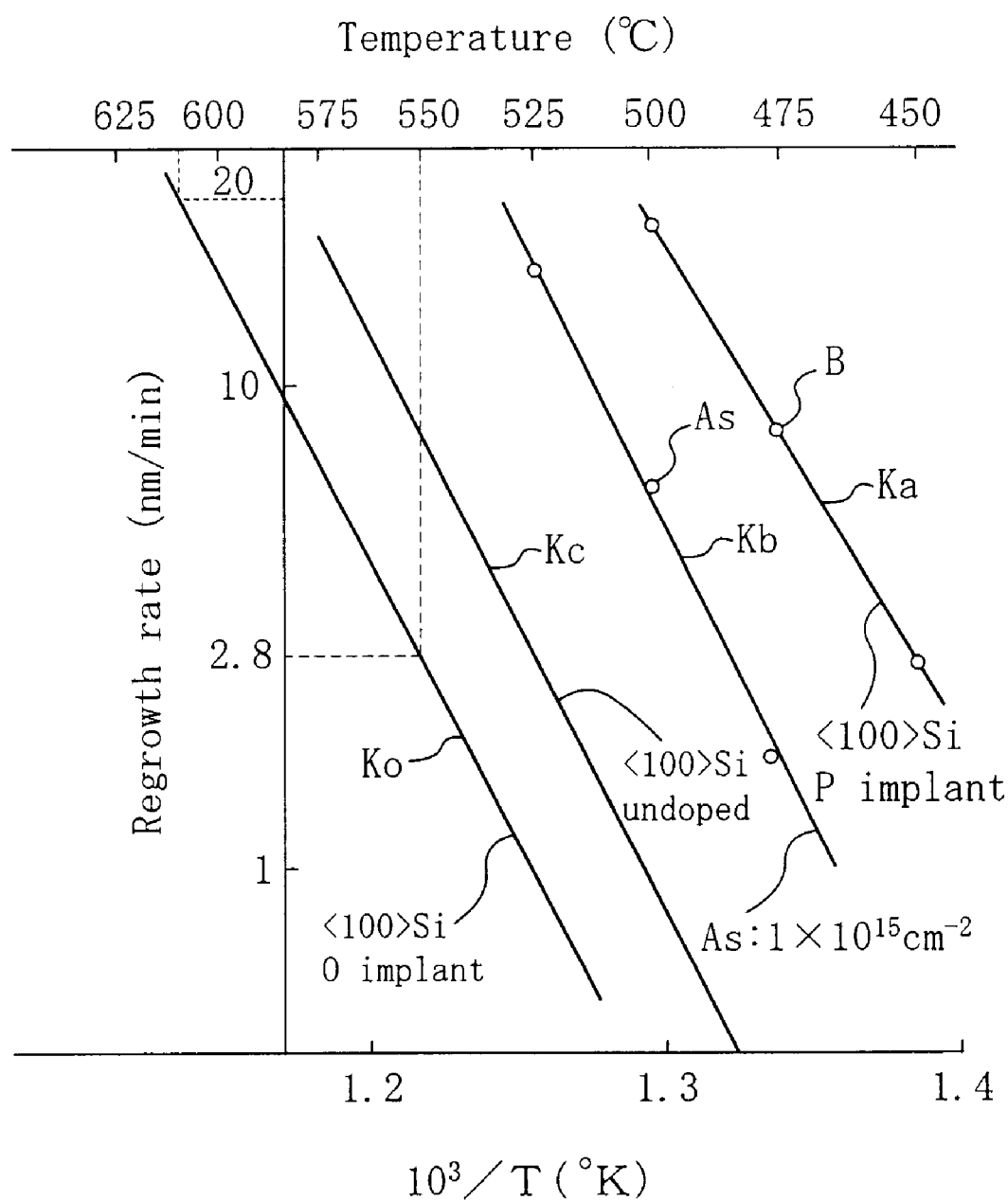
FIG. 8 shows data indicative of the relationship between reordering rate and annealing temperature T recited from a document in conjunction with the relationship between reordering rate and annealing temperature T in a silicon substrate in which oxygen at a high concentration has been implanted.

FIG. 7 is a flow chart illustrating the procedure of determining a temperature based on the relationship between the annealing time T and the reordering rate. FIG. 8 shows data indicative of the relationship between the reordering rate and the annealing time T disclosed in Document 1 (J. Appl. Phys., Vol. 48, No. 10, October 1977) in conjunction with the relationship between the reordering rate and the annealing time T in a silicon substrate in which oxygen has been introduced at a high concentration. In accordance with the flow chart of FIG. 7, the procedure leading to temperature determination will be described.

In Step ST21, a sample for determining the relationship between the temperature and the reordering rate is prepared. In the sample, oxygen has been introduced at a concentration of $3.2 \times 10^{19}$ atoms·cm$^{-3}$ or more into the entire amorphous region, as shown in FIG. 4(c).

Next, in Step ST22, the relationship between the temperature and the reordering rate is derived. As a method of deriving the relationship, the one invented by the present inventors and disclosed in International Application No. PCT/JP98/02567 is used. Specifically, the thickness of the amorphous region is determined based on the configuration of the cos A spectrum or the like by using spectro ellipsometry or by further considering an acceleration voltage or the quantity of implanted ions. The reordering rate (L/t) (nm/min) can be calculated from the thickness Lnm of the portion of the amorphous region of the sample that has been recrystallized in a given time t. By plotting reordering rates at different annealing temperatures in a graph in which the horizontal axis represents the temperature and the vertical axis represents the reordering rate (on a logarithmic scale), the line Ko shown in FIG. 8 is produced. It is also possible to produce a relational expression representing the function of the reordering rate using the annealing temperature as a variable by applying the relationship to the equation $T=f\{(L/t)\}$.

The other lines shown in FIG. 8 are indicative of data on the different samples named in the document. The line Ka is indicative of data on the sample in which an amorphous region has been formed by successively implanting phosphorus (P) and boron (B) into a silicon substrate. The line Kb is indicative of data on the sample in which an amorphous region has been formed by implanting arsenic (As) into a silicon substrate. The line Kc is indicative of data on the sample in which an amorphous region has been formed by implanting silicon into a silicon substrate. It is also possible to draw the line Ko shown in FIG. 8 by using the relations among the lines shown in FIG. 8 that have been obtained by experiment associated with the document. The line Ko can easily be obtained by marking a point at the coordinates of 550° C. and 2.8 nm/min based on the data shown in FIG. 6 and drawing a line extending through the point in parallel with the lines Kb and Kc.

Next, in Step ST23, a sample for actually performing temperature measurement (temperature value or temperature distribution) at a top surface of a wafer is prepared. In the present specification (including claims), "temperature measurement" is defined to include the measurement of at least one of a temperature value and a temperature distribution. The sample has the structure shown in FIG. 4(c). In Step ST24, the reordering rate is calculated by using the line Ko shown in FIG. 8 and using ellipsometric measurement as described above so that the annealing temperature corresponding to the reordering rate in the line Ko is determined. If the line Ko is used, e.g., the annealing temperature T when the reordering rate value is 20 nm/min is about 610° C., as shown in FIG. 8.

According to the present embodiment, a temperature at the top surface of the wafer can be measured by using the sample having the amorphous region (ion implanted region) into which oxygen has been implanted at a high concentration. In the case of performing temperature measurement by using conventional data (lines Ka, Kb, and Kc) as shown in FIG. 8, it is particularly difficult to measure a temperature of 600° C. or more even by using the line Kc. By contrast, the method of the present embodiment enables the measurement of a high temperature in the vicinity of 650° C. by using the line Ko. To obtain highly reliable data, however, a maximum measurable temperature is around 575° C. with the line Kc and around 610° C. with the line Ko. Since measurement accuracy (reliability) is higher as the reordering rate is lower, it will be understood that the use of the line Ko provides higher measurement accuracy than the use of the line Kc if a comparison is made between the measurement accuracies at the same temperature (e.g., 550° C.). In general, if the reordering rate is 100 nm/min or lower, the calculation of the reordering rate has a reduced error and accurate temperature measurement can be performed. For this reason, the reordering rate of the sample is preferably lower to accurately measure a high temperature.

The method of measuring a temperature described in the present embodiment may be practiced by providing a sample wafer for temperature evaluation with a region into which oxygen has been introduced at a high temperature or, alternatively, by providing a product wafer with a monitor region for temperature measurement into which oxygen has been implanted at a high concentration.

Although the first embodiment has adjusted the concentration of oxygen to the critical value of $3.2 \times 10^{19}$ atoms·cm$^{-3}$ or higher, temperature measurement can also be performed by introducing oxygen at a concentration lower than the critical value into the entire amorphous region. As can be seen from the data shown in FIG. 3, after reordering by the initial flash anneal is completed in different samples into which oxygen has been introduced in different amounts, the amorphous regions are reordered at reordering rates peculiar to respective annealing temperatures. As for the sample containing oxygen at a concentration lower than the critical value, a line deviated rightward from the line Ko shown in FIG. 8 is obtained as a line indicative of the relationship between the annealing time and the reordering rate. As can be seen from FIG. 8, accuracy of temperature measurement is higher as the reordering rate is lower. However, if the reordering rate is excessively low, such a problem as an elongated measurement period is encountered. In the case of performing in-line measurement by forming a wafer with a monitor region into which oxygen has been implanted, it is necessary to consider a temperature and an annealing time compatible with the process. By thus varying the oxygen concentration, an optimum reordering rate can be selected.

Although the first embodiment has used a combination of knock-on implantation of oxygen by As ions and implantation of oxygen ions to form the amorphous region in which the oxygen concentration is $3.2 \times 10^{19}$ atoms·cm$^{-3}$ or more, the present invention is not necessarily limited to the combination. It is also possible to use only implantation of oxygen ions. In that case, if a clustered fabrication apparatus is used to remove a natural oxide film by a heat treatment performed under vacuum in a certain chamber of the apparatus and implant oxygen ions in another chamber, there can be implemented the state with no knocked-on oxygen, which offers the advantage of more reliable control of the oxygen concentration.

Embodiment 2

A method of measuring a temperature distribution according to a second embodiment of the present invention will be described. In the second embodiment, a temperature distribution within a thermal CVD apparatus is measured by basically using the method in accordance with the first embodiment.

First, the relationships between reordering rates and annealing temperatures represented by lines as shown in FIG. 8 are obtained in advance. For example, the line Ko shown in FIG. 8 and the like are obtained by the procedure of Steps ST21 and ST22 in FIG. 7 and a sample wafer for temperature evaluation is produced by implanting oxygen into a plurality of portions thereof at which temperatures are to be measured actually under the same conditions. At this time, the sample wafer is produced appropriately by performing the steps illustrated in FIGS. 4(a) to 4(c) at the plurality of measurement points. Specifically, there is prepared the sample wafer having amorphous regions each containing oxygen at a critical concentration ($3.2 \times 10^{19}$ atoms·cm$^{-3}$) or more by performing the two implantation steps which are the steps of implanting oxygen by using the knock-on effect and then implanting oxygen ions. By using the sample wafer, a temperature distribution within the thermal CVD apparatus being used will be measured as follows.

The sample wafer is set at a position at which a product wafer is actually placed in the thermal CVD apparatus for, e.g., depositing a silicon oxide film. The sample wafer is held within the thermal CVD apparatus for a given time t (min) under the same temperature condition as used to deposit the silicon oxide film. The reordering rates (L/t) can be determined based on the thicknesses Lnm of the portions of the amorphous regions in the sample wafer which have been recrystallized during the lapse of the specified time t (min). If the reordering rates (L/t) at the individual portions of the sample wafer are applied to the line Ko of FIG. 8, temperatures at the individual portions, i.e., a temperature distribution in the thermal CVD apparatus can be measured accurately. Data on the temperature distribution is produced as data shown in FIG. 23 of International Publication PCT/JP98/02567. By preliminarily measuring a temperature distribution over the wafer, it is also possible to determine the relationship between the production yield of silicon chips cut out of each portion of the wafer and the CVD temperature.

It will easily be appreciated that temperatures can be measured only at representative portions in the thermal CVD apparatus or the like. In that case, if a set temperature displayed on an additional temperature control unit provided in the thermal CVD apparatus is T0 and an actual temperature is T, the temperature difference ΔT therebetween is an error produced by the thermal CVD apparatus. In an actual CVD process, therefore, the process can be controlled by correcting the error.

By placing the sample at an arbitrary position in various apparatus including a thermal CVD apparatus, e.g., at a gas inlet port or outlet port other than the position at which the wafer is placed, accurate temperature measurement can be performed at a desired position in the apparatus.

Although the present embodiment has used implantation of As ions to form the amorphous regions, ions of silicon or phosphorus can also be implanted besides As ions.

Embodiment 3

A description will be given next to a third embodiment related to a sample for evaluation in which a temperature measurable range has been widened by providing a wafer with regions having individually adjusted reordering rates.

Figure 9:
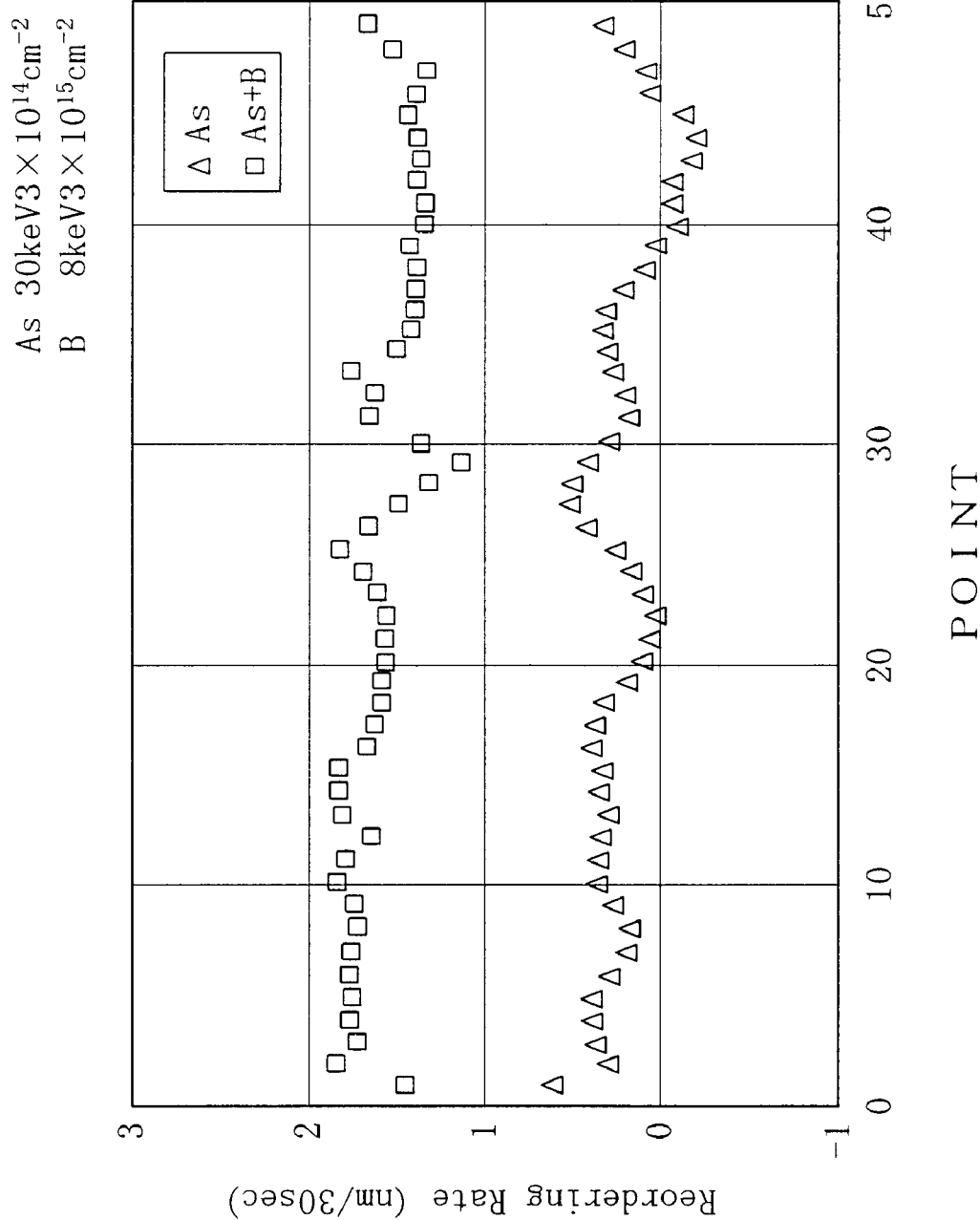
FIG. 9 shows, for comparison, data on reordering rates when only As has been implanted and when As and B have been implanted in a third embodiment of the present invention.

FIG. 9 shows, for comparison, data when only arsenic is implanted and data when arsenic (As) and boron (B) are implanted. In the drawing, the horizontal axis represents measurement points (49 points) in the wafer and the vertical axis represents the reordering rates of amorphous regions. Sample wafers were prepared by implanting arsenic (As) with an acceleration voltage of 30 keV and a dose of $3 \times 10^{14}$ atoms·cm$^{-2}$ (data indicated by the mark Δ in the drawing), while implanting arsenic (As) with an acceleration voltage of 30 keV and a dose of $3 \times 10^{14}$ atoms·cm$^{-2}$ and subsequently implanting boron (B) with an acceleration voltage of 8 keV and a dose of $3 \times 10^{15}$ atoms·cm$^{-2}$ (data indicated by the mark □ in the drawing), thereby forming respective amorphous regions. Oxygen ions were not implanted. The reordering rates of the amorphous regions were measured. From the data obtained, the following conclusion can be drawn.

As shown in FIG. 9, if a comparison is made between respective mean values at the individual measurement points, the reordering rate is lower in the amorphous region implanted only with arsenic (As) than in the amorphous region implanted with arsenic (As) and boron (B). This proves that the adjustment of the reordering rate can be performed not only by adjusting the concentration of implanted oxygen ions as in the first embodiment but also by changing or combining ion species. Since an adjustable reordering rate indicates an adjustable range of temperatures that can be measured reliably under real conditions, the temperature measurable range can be adjusted if necessary by variously combining such ion species to be implanted.

Figure 10:
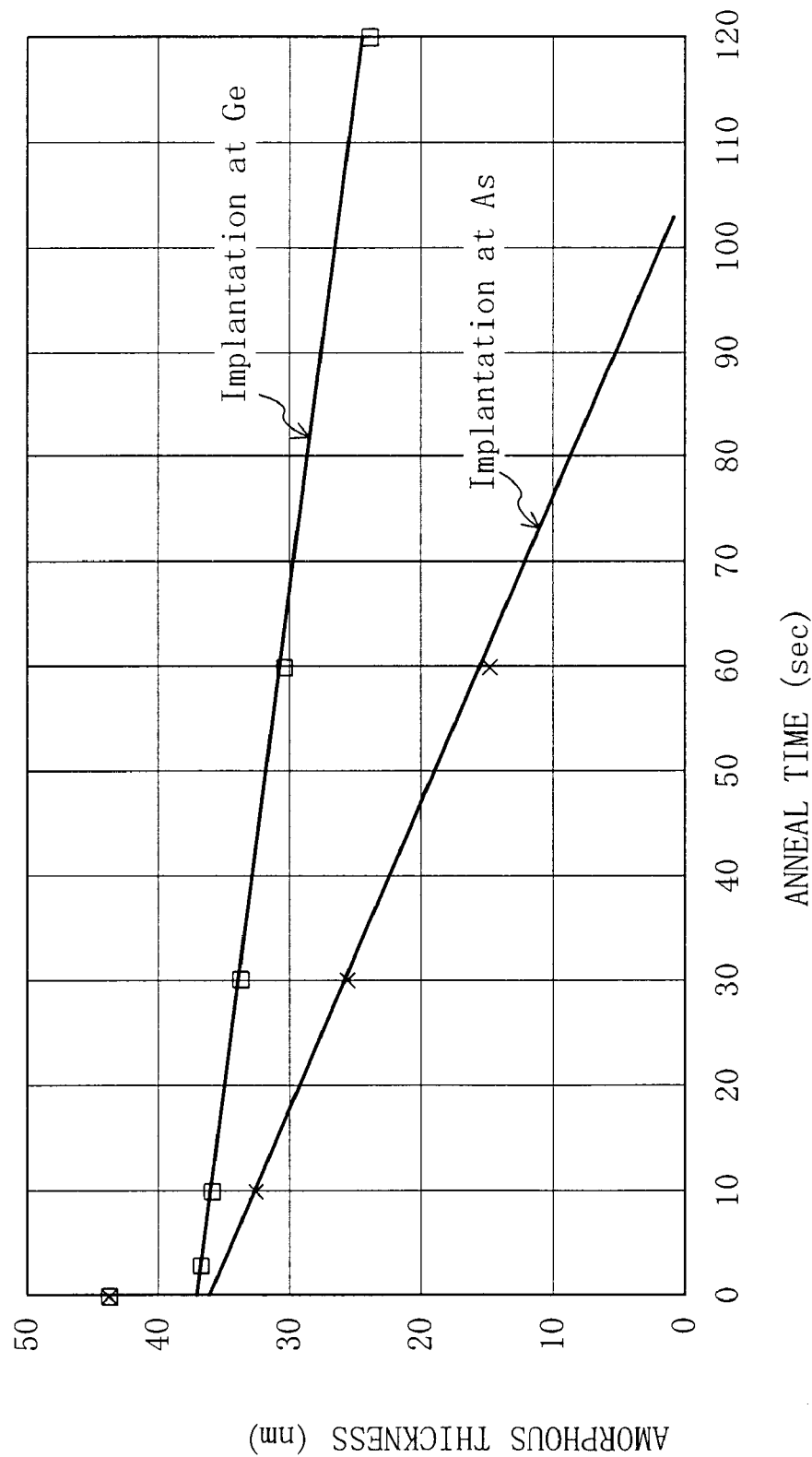
FIG. 10 shows the difference between respective reordering rates in an amorphous region formed by Ge implantation and in an amorphous region formed by As implantation in the third embodiment.

FIG. 10 shows the difference between the respective regrowth rates of the amorphous region formed by Ge implantation and the amorphous region formed by As implantation. Each of the implantations was performed with an acceleration voltage of 30 keV and a dose of $3 \times 10^{14}$ atoms·cm$^{-2}$. The annealing temperature was 550° C. for each of the amorphous regions. As shown in the drawing, since the regrowth rate of the Ge-implanted amorphous region is lower than the regrowth rate of the As-implanted amorphous region, the Ge-implanted amorphous region can be subjected to the measurement of a higher temperature than the As-implanted amorphous region.

Figure 11A:
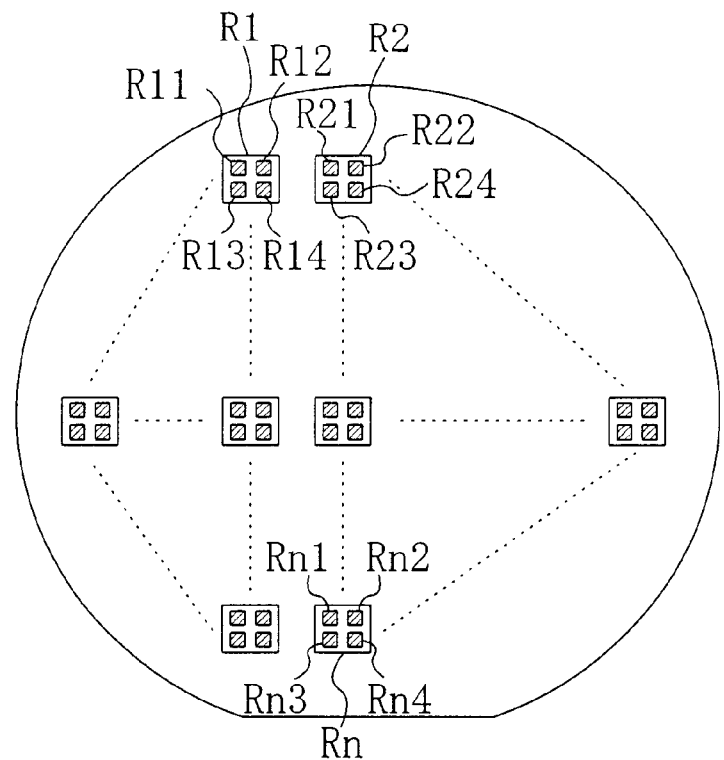
FIGS. 11(a) and 11(b) are plan views illustrating two methods of forming a sample wafer for evaluation provided with four amorphous regions having different reordering rates in the third embodiment.
Figure 11B:
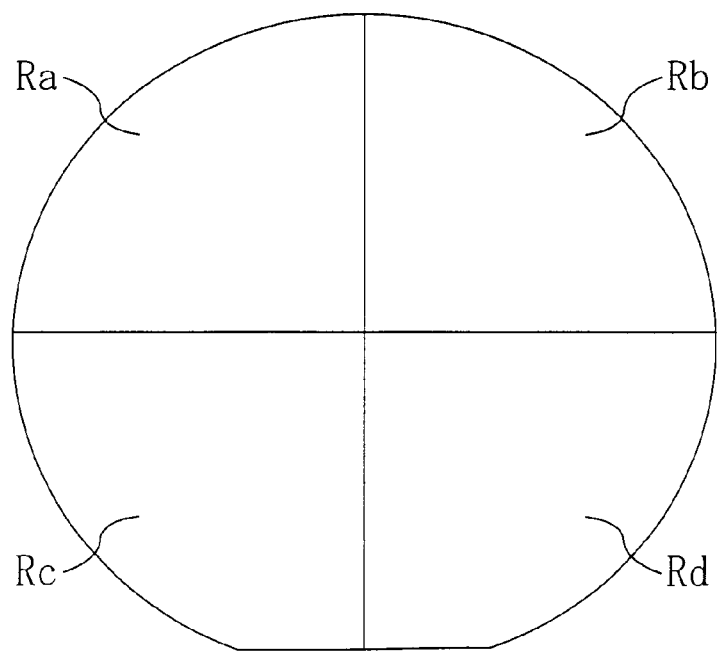

FIGS. 11(a) and 11(b) are plan views illustrating two methods of forming a sample wafer for evaluation having four amorphous regions with different regrowth rates.

In accordance with one of the methods, n points for temperature measurement R1, R2, . . . , Rn (n is a natural number) are provided in the wafer, as shown in FIG. 11(a). The points R1, R2, . . . , Rn are provided with first amorphous regions R11, R21, . . . , Rn1 which are implanted with arsenic (As) and boron (B) and correspond to the data indicated by the mark □ in FIG. 9, with second amorphous regions R12, R22, . . . , Rn2 which are implanted only with arsenic (As) and correspond to the data indicated by mark Δ in FIG. 9, with third amorphous regions R13, R23, . . . , Rn3 which are implanted with germanium (Ge) at a dose of $1 \times 10^{15}$ atoms·cm$^{-2}$ and illustrated in FIG. 10, and with fourth amorphous regions R14, R24, . . . , Rn4 which are implanted with arsenic (As) and oxygen (O) at a concentration equal to or higher than the critical value and described in the first embodiment. In accordance with the other method, the wafer is divided into four regions which are: a first amorphous region Ra implanted with arsenic (As) and boron (B) and corresponding to the data indicated by the mark □ shown in FIG. 9; a second amorphous region Rb implanted only with arsenic (As) and corresponding to the mark A shown in FIG. 9; a third amorphous region Rc implanted with germanium (Ge) at a dose of $1\times10^{15}$ atoms·cm−2 and described in FIG. 10; and a fourth amorphous region Rd implanted with arsenic (As) and oxygen (O) at a concentration equal to or higher than the critical value and described in the first embodiment, as shown in FIG. 11(b).

Figure 12:
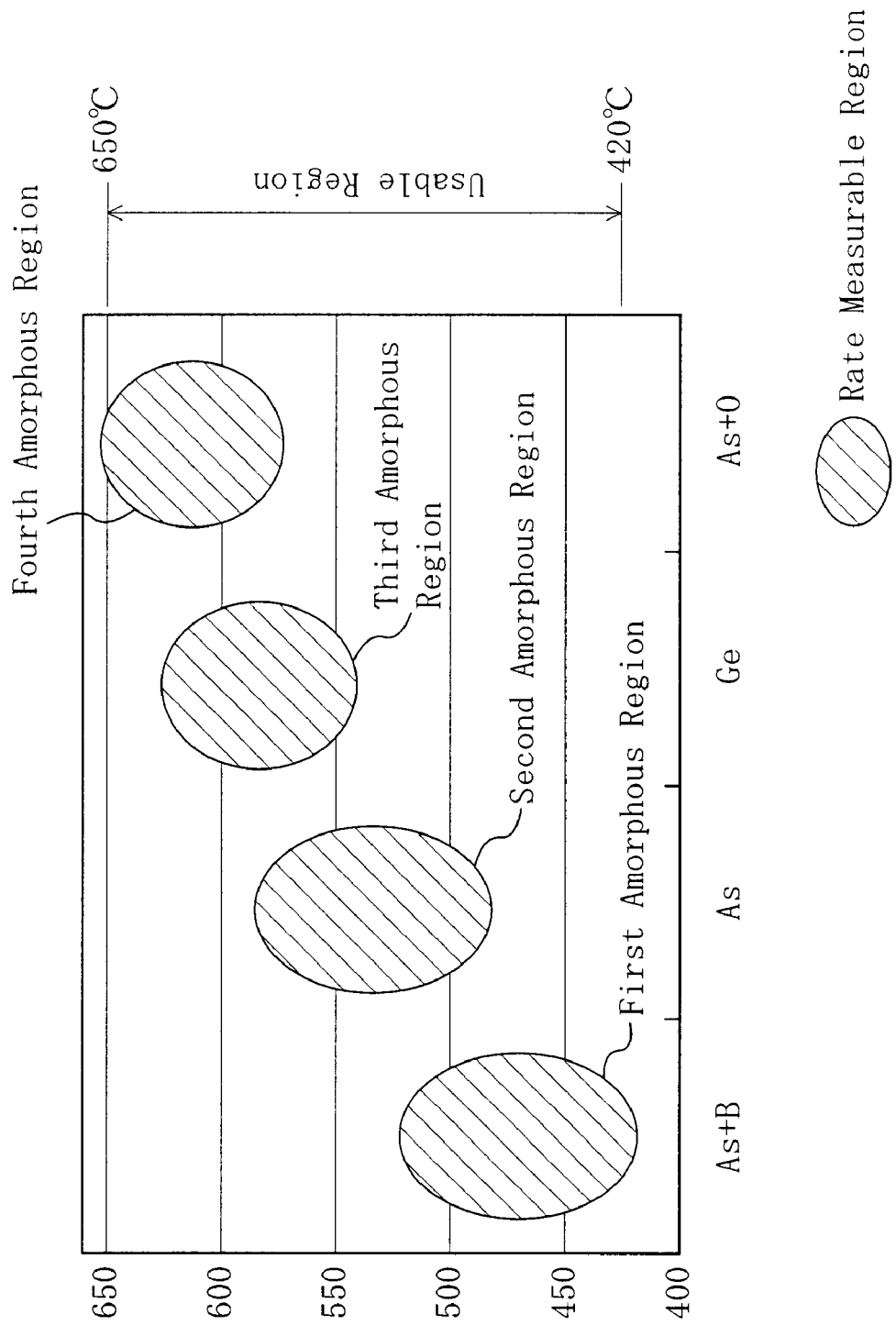
FIG. 12 shows respective temperature measurable ranges in the individual amorphous regions when the sample wafer for evaluation shown in FIGS. 11 is used.

FIG. 12 shows the respective temperature measurable ranges of the individual amorphous regions when the sample wafer for evaluation shown in FIG. 11(a) or 11(b) is used. If the regrowth rate is low, the proper temperature measurable range shifts to a higher temperature. If the regrowth rate is high, on the other hand, the proper temperature measurable range shifts to a lower temperature. In this case, the practical range of temperatures that can be measured reliably is 420° C. to 525° C. in the first amorphous region R1, 480° C. to 580° C. in the second amorphous region R2, 540° C. to 625° C. in the third amorphous region R3, and 575° C. to 650° C. in the fourth amorphous region R4. By thus providing the single evaluation wafer with the first to fourth amorphous regions having the four temperature measurable ranges, the temperatures in the range of 420° C. to 650° C. can be measured.

In the case of using the sample wafer shown in FIG. 11(a), a temperature distribution over a surface of the wafer can be measured in a wide temperature range by providing the wafer with the numerous temperature measurement points R1, R2, . . . , Rn each having the first to fourth amorphous regions.

In the case of using the sample wafer shown in FIG. 11(b), if the temperature in a certain process step is unknown, a precise temperature distribution can be measured by initially determining a rough temperature and then performing temperature measurement again. For example, it is assumed that only the first amorphous region Ra is reordered as a result of performing temperature measurement by using the sample wafer. At that time, since the temperature range can be determined to be 425° C. to 520° C. based on the data shown in FIG. 12, a precise temperature range can be measured by producing a sample wafer having the first amorphous region Ra occupying the entire surface of the wafer and performing temperature measurement by using the sample wafer.

Embodiment 4

Next, a description will be given to a fourth embodiment related to ion implantation at a low temperature. FIGS. 13(a) to 13(d) are cross-sectional views showing respective interfacial configurations between crystal regions and amorphous regions formed by implanting arsenic (As) under such conditions that the substrate temperature is 0° C., −10° C., −20° C., and −30° C. Under each of the conditions, arsenic was implanted with an acceleration voltage of 30 keV and a dose of $3.0\times10^{14}$ atoms·cm$^{-2}$. It is to be noted that the substrate temperature in the present embodiment was not obtained by directly measuring the temperature of the substrate in accordance with the method of the present invention but was the temperature of a platen for carrying a wafer. Accordingly, the temperature at the top surface of the wafer is supposed to be lower by several degrees than the temperature of the platen.

Figure 13A:
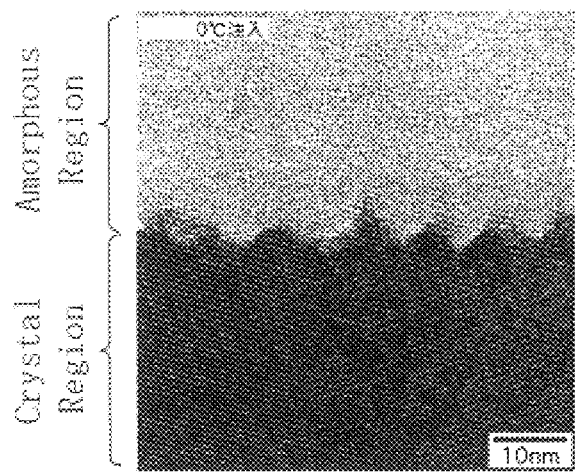
FIGS. 13(a) to 13(d) are cross-sectional views showing respective interfacial configurations between amorphous regions and crystal regions formed by implanting arsenic (As) at different substrate temperatures of 0° C., −10° C., −20° C., and −30° C.
Figure 13B:
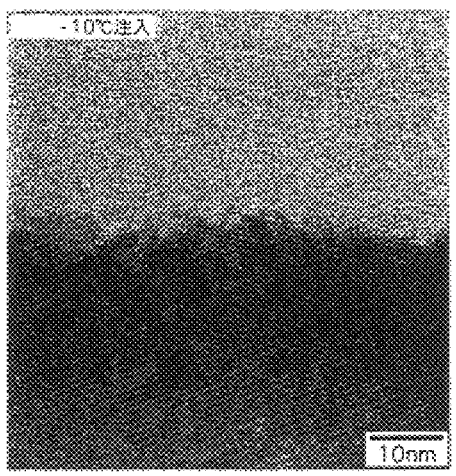
Figure 13C:
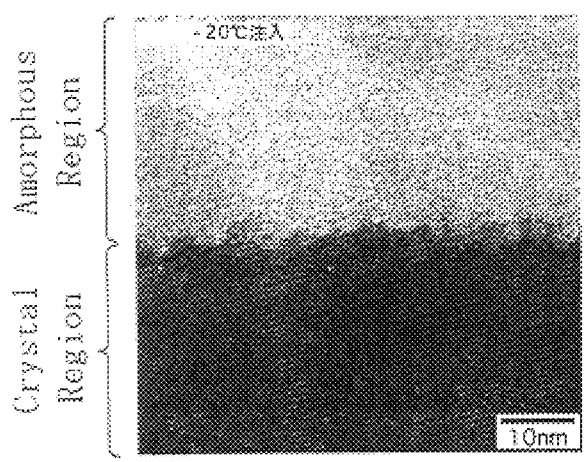

As can be seen from FIGS. 13(a) to 13(d), the interfaces between the crystal regions and the amorphous regions formed by implanting arsenic (As) under such conditions that the substrate temperature was 0° C. and −10° C. shown in FIGS. 13(a) and 13(b) are not defined distinctly and the roughness of the portions that seem to be the interfaces is considerable, though there are slight variations. That is, the boundaries between the amorphous regions and the crystal regions are not distinct and the two regions are presumably in an intermingled state around the boundaries. By contrast, the interfaces formed by implanting arsenic (As) under such conditions that the substrate temperature was 0° C. and −10° C. are defined distinctly with reduced roughness.

In the case where arsenic (As) was implanted nearly at a room temperature, the boundary between the amorphous region and the crystal region was not defined distinctly and the roughness of the portion that seems to be the interface was considerable, similarly to the case where arsenic (As) was implanted under such a condition that the substrate temperature was 0° C.

FIG. 14 shows the regrowth rate of an amorphous region formed by ion implantation at a low temperature. In the drawing, the horizontal axis represents the annealing time and the vertical axis represents the thickness of the amorphous region. The data shown in the drawing was obtained by implanting arsenic (As) with an acceleration voltage of 30 keV and a dose of $3.0\times10^{14}$ atoms·cm$^{-2}$. The mark □ indicates data obtained in an amorphous region formed by ion implantation at a room temperature and the mark ○ indicates data obtained in the amorphous region formed by ion implantation at a low temperature. As shown in the drawing, the regrowth rate of the amorphous region formed by ion implantation at a room temperature becomes constant after a certain lapse of the annealing time (in this case, about 10 sec). Since the initial thickness is deviating rather upwardly from the line, the regrowth rate in a region corresponding to the initial flash anneal is considered to be increased. By contrast, the regrowth rate of the amorphous region formed by ion implantation under such a condition that the substrate temperature is −40° C. is nearly constant from the beginning. The reason for the difference may be as follows.

In the case of forming the amorphous region by ion implantation at a room temperature, the boundary between the amorphous region and the crystal region is not distinct and the roughness of the interface therebetween is considerable, similarly to the case where the substrate temperature was 0° C. shown in FIG. 13(a). Accordingly, the thickness of the amorphous region is considered to decrease seemingly rapidly in the early stage of annealing immediately after the initiation thereof. In particular, data on the initial thickness which was measured to be larger than the value of a point on the line may indicate that the thickness of the amorphous region was measured with the thickness of a region in a crystal state partially included therein. The thickness of the amorphous region decreases at a low and constant speed from the time point on at which recrystallization has proceeded to a certain degree, the boundary therebetween is defined distinctly, and the roughness of the interface is reduced (after a lapse of about 10 sec in FIG. 14).

Figure 13D:
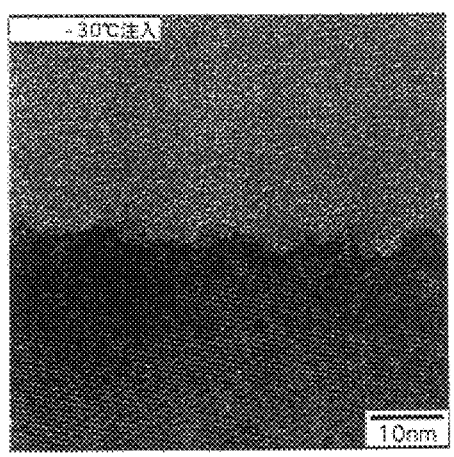

In the case of forming the amorphous region by ion implantation at a low temperature, by contrast, the boundary between the amorphous region and the crystal region is defined distinctly and the roughness of the interface is reduced, similarly to the case where the substrate temperature was −30° C. shown in FIG. 13(d). Accordingly, a nearly constant regrowth rate is achievable from the initiation of annealing. Since the regrowth rate was about 21 (nm/min) in either case, it will be understood that the regrowth rate itself is uniquely determined depending on the concentration of arsenic (As).

Figure 15:
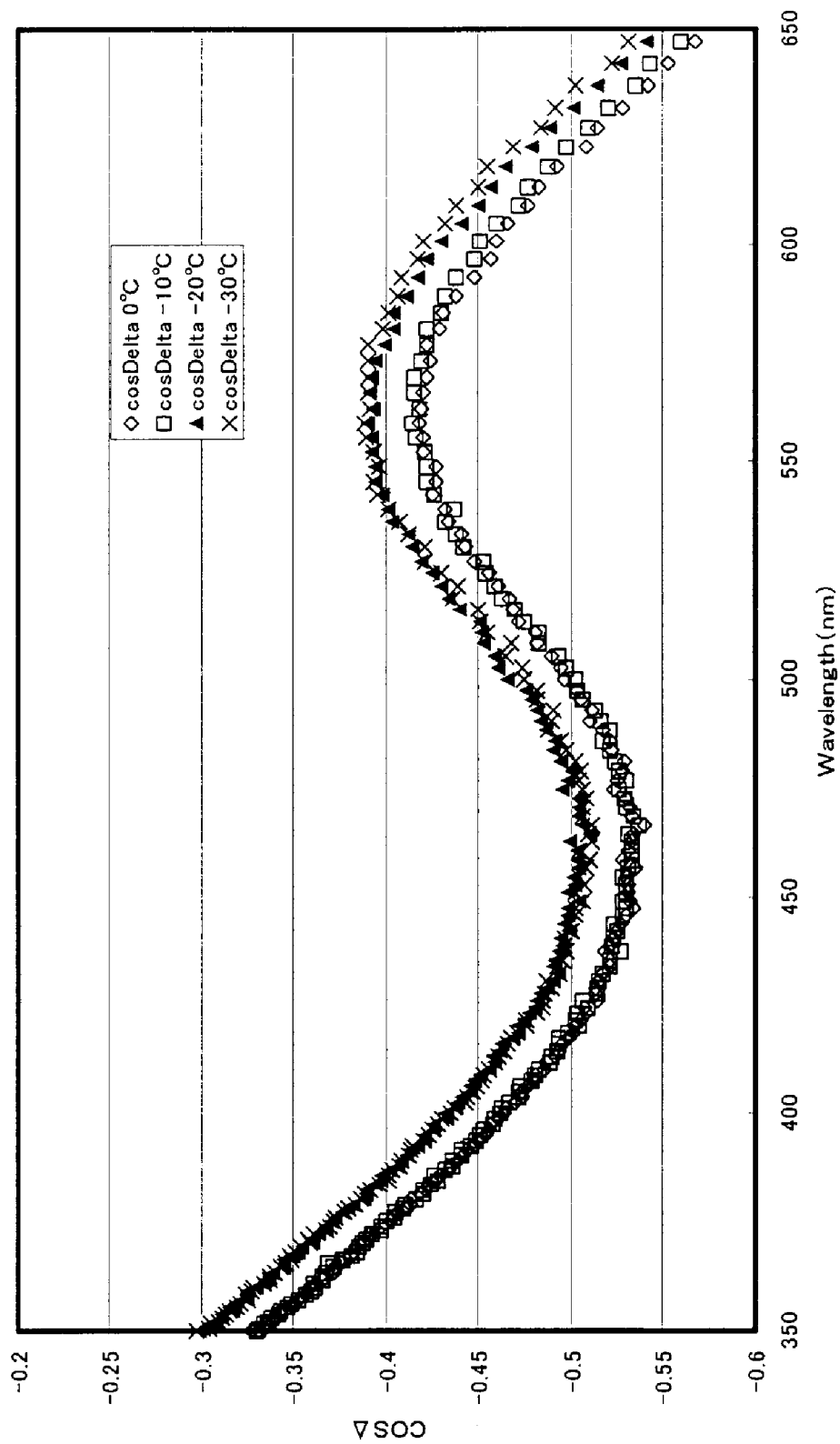
FIG. 15 shows a part of cos Δ spectra obtained by spectro ellipsometric measurement performed with respect to the amorphous regions formed under the doping conditions shown in FIGS. 13(a) to 13(d)

FIG. 15 shows a part of cos Δ spectra obtained by spectro ellipsometric measurement performed with respect to the amorphous regions formed under the implantation conditions shown in FIGS. 13(a) to 13(d). In the drawing, the horizontal axis represents the wavelength of measuring light and the vertical axis represents cos Δ values. As shown in the drawing, the spectro ellipsometric spectra from the amorphous regions formed by ion implantation under such conditions that the substrate temperature was 0° C. and −10° C. are distinctly separate from the spectro ellipsometric spectra from the amorphous regions formed by ion implantation under such conditions that the substrate temperature was −20° C. and −30° C., so that a distinct structural difference is presumed between the two groups of spectra.

From the data shown in FIGS. 13(a) to 13(d), FIG. 14, and FIG. 15, it has been concluded that a distinct boundary can be provided between an amorphous region and a crystal region and the roughness of the interface can be reduced by performing ion implantation under a low-temperature condition where the substrate temperature is lower than 10° C. This achieves the following effects.

The first effect is the increased accuracy and reliability of temperature measurement, which has been achieved by the following two factors. First, it is required by temperature measurement to determine the rate of regrowth of an amorphous region induced by annealing. To determine the regrowth rate, it is necessary to measure the thickness of the amorphous region by ellipsometry or the like. In measuring the thickness, differences in thickness between, e.g., 49 points as shown in FIG. 9 (which are not for measuring a temperature distribution) are reduced. Since the thickness of the amorphous region measured at the 49 points become nearly equal with high reproducibility, the values of the regrowth rates at the individual points, i.e., temperature values become equal. By providing a distinct boundary between the two regions or reducing the roughness of the interface, therefore, variations in measured values are reduced and the accuracy and reliability with which a temperature or a temperature distribution is measured are increased.

As has been discussed above, it may be considered from the result of the experiment shown in FIG. 14 that, if the boundary between the two regions is not distinct and the roughness of the interface is considerable, the initial regrowth rate is high and varies greatly till the boundary becomes distinct or the roughness of the interface is reduced. This has been indicated by the results of various experiments. If the boundary between the amorphous region and the crystal region is not distinct and the roughness of the interface is considerable during ion implantation, it is necessary to remove data immediately after the initiation of annealing in calculating the regrowth rate. However, since annealing actually performed is mostly a short-period flash anneal (also termed a spike anneal), the initial regrowth rate is particularly important if in-line temperature measurement is to be performed. Hence, the regrowth rate becomes stable and nearly constant even in the early stage of annealing by forming the two regions such that a distinct boundary is provided therebetween and the roughness of the interface is reduced. As a result, a temperature value can be measured with increased accuracy and reliability.

The second effect is an increased utility value of low temperature ion implantation as preamorphous implantation in the process of fabricating an actually used device. The preamorphous implantation is ion implantation performed prior to the step of salicidation to provide an amorphous structure by disturbing the crystallinity of the source/drain regions (for accelerated silicidation) or ion implantation performed prior to the implantation of boron ions at a low concentration to prevent channeling. Although the foregoing effects of increasing the accuracy of temperature measurement by increasing the smoothness of the interface can be achieved by using another means, ion implantation at a low temperature achieves the following effects in addition to the increased accuracy of temperature measurement.

By thus increasing the concentration of oxygen in the amorphous region to a critical value or more, e.g., the relationship between the annealing temperature and the reordering rate can be wholly represented by a single straight line (see FIG. 6), so that numerical expressions representing the relationships between the regrowth rates and the temperatures shown in FIG. 8 can be determined. Although the increased concentration of oxygen in the amorphous region does not adversely affect a wafer for temperature evaluation, it causes an oxygen induced stacking fault (OSF) in an actually used device and degrades the operating properties of the device. Hence, the implantation of oxygen ions at a high concentration is inappropriate as preamorphous implantation in the actually used device.

On the other hand, a distinct boundary can be provided between an amorphous region formed by ion implantation and a crystal region by implanting arsenic ions or the like at a relatively high dose (on the order of, e.g., $4 \times 10^{15}$ cm$^{-2}$), which will be described later. However, since a natural oxide film is normally present on the surfaces of regions to be silicided (source/drain regions), oxygen is also implanted into the regions by the knock-on effect if arsenic ions at a high concentration or the like are implanted (see FIG. 2). Consequently, it becomes difficult to surely suppress the occurrence of an oxygen induced stacking fault.

If ion implantation at a low temperature is used, by contrast, a distinct boundary can be provided between an amorphous region and a crystal region or the roughness of the interface can be reduced by merely implanting arsenic ions or the like at a concentration on the order of $3 \times 10^{14}$ cm$^{-2}$, which is lower by about one order of magnitude as shown in FIG. 14. In the case of implanting an element heavier than oxygen, the concentration of oxygen implanted by the knock-on effect is reduced by about one order of magnitude when the amount of the implanted element is reduced by one order of magnitude. As can be seen from the oxygen concentration profile shown in FIG. 2 according to the first embodiment, the concentration of oxygen in the amorphous region is barely different from the concentration of oxygen originally contained in a silicon substrate (about $2.0 \times 10^{18}$ cm$^{-3}$) if the concentration of knocked-on oxygen is reduced to about 1/10. In this case, therefore, the amount of oxygen introduced by the knock-on effect can be reduced even if a natural oxide film is present on the regions to be silicided, so that the occurrence of an oxygen induced stacking fault is surely suppressed. By implanting ions of arsenic or the like at a low temperature as preamorphous implantation which is a preliminary process for salicidation step, it becomes possible to increase the accuracy and reliability of temperature measurement, while suppressing the occurrence of an oxygen induced stacking fault, if in-line temperature measurement is to be performed.

The third effect is a smooth silicide layer that can be performed as a result of providing a distinct boundary between an amorphous region and a crystal region or reducing the roughness of the interface by using ion implantation at a low temperature as preamorphous implantation. As a result, there can be achieved the effect of suppressing a junction leakage occurring at a PN junction underlying the interface in a diffusion layer having a salicide structure.

The fourth effect is a shallow diffusion layer that can be formed with high reproducibility in the case of using ion implantation at a low temperature as preamorphous implantation for preventing channeling. When annealing is performed to activate born or the like that has been implanted, it is known that the speed at which boron or the like is diffused is increased in the vicinity of a region having a disturbed structure adjacent the boundary between the amorphous region and the crystal region. If the boundary between the two regions is not distinct and the roughness of the interface is considerable, the disturbed structure is assumed to extend over a large area so that the diffusion layer is expanded and variations among lots are significant. By contrast, a distinct boundary can be provided between the two regions and the roughness of the interface can be reduced by using ion implantation at a low temperature as preamorphous implantation. This allows a shallow diffusion layer to be formed with high reproducibility through the activation of implanted boron ions or the like.

Although the present embodiment has described the case where As is implanted as an ion species, the same effects can be achieved by implanting Ge at a similar dose instead of As. This is because Ge has an atomic number (32) close to that of arsenic (33) and Ge actually implanted is in most cases $Ge^{33}$, which is an isotope of Ge having substantially the same mass as arsenic. It is also possible to use ion implantation of an IV group element having a mass larger than that of Ge.

Embodiment 5

Next, a description will be given to a fifth embodiment related to ion implantation of a IV group element such as Ge. The IV group elements include C, Si, Ge, Sn, and Pb.

Figure 16:
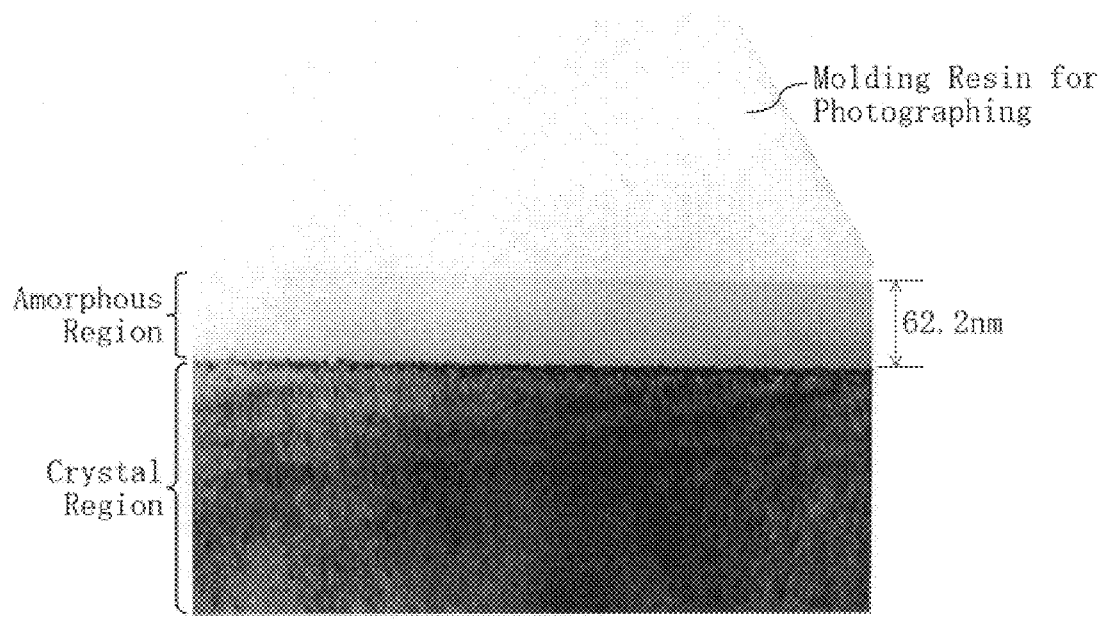
FIG. 16 is a TEM micrograph showing a structure adjacent the boundary between an amorphous region formed by implanting Ge as an IV group element and a crystal region underlying the amorphous region in a fifth embodiment of the present invention.

FIG. 16 is a TEM micrograph showing a structure adjacent the boundary between an amorphous region formed by implanting Ge as a IV group element into a silicon substrate with an acceleration voltage of 30 keV and a dose of $4\times10^{15}$ $cm^{-2}$ and a crystal region underlying the amorphous region. As shown in the drawing, the boundary between the amorphous region formed by the implantation of Ge ions and the crystal region is distinct and the roughness of the interface is reduced. It was proved that the effect was surely achievable if the dose is $1\times10^{15}$ $cm^{-2}$ or more in the case of implanting Ge ions at a room temperature.

Therefore, the present embodiment can also achieve the first to fourth effects described in the fourth embodiment. Moreover, Ge is a IV group element which remains neutral in terms of a conductivity type even when it is implanted into silicon. In other words, Ge is prevented from affecting the operation of the device whether it is implanted in an N-type diffusion layer or in a P-type diffusion layer. Hence, the implantation of Ge ions can be used as preamorphous implantation in the process of fabricating an actually used CMOS device.

The ion species is not limited to Ge and such an element as C, Si, Sn, or Pb can be used instead as the ion species. In the case of using an element having a small mass, however, it is difficult to form an amorphous region having a distinct boundary between itself and a crystal region unless a dose is increased. Therefore, Ge or a IV group element having a mass larger than that of Ge is preferably used.

The same effects can also be achieved by implanting ions of arsenic (As), phosphorus (P), a halogen element, an inert gas element, or the like instead of using a IV group element. In that case, there is offered the advantage that $GeF_4$, which is a corrosive gas necessary when Ge is used, need not be used as an ion species.

Embodiment 6

A description will be given to a sixth embodiment related to low-temperature annealing after ion implantation.

As described in the fourth embodiment, the boundary between the amorphous region formed by implanting ions at a low concentration and the crystal region is not distinct. In that case also, however, it is possible to provide a distinct boundary between the two regions or reduce the roughness of the interface by performing low-temperature annealing (at 300 to 450° C.).

In the present embodiment, it was proved that the boundary which was not distinct yet in the early stage of annealing became gradually distinct and reordering had proceeded till the boundary between the amorphous region and the crystal region became distinct or the roughness of the interface was reduced but reordering had not proceeded any more. By thus preparing a wafer having a distinct boundary between the amorphous region and the crystal region or the interface with reduced roughness as a wafer for specifying a temperature, the relationship between the annealing temperature and the amount of reordering can be represented by a nearly straight line from the beginning, so that the accuracy of temperature measurement is increased.

It is also possible to form a smooth silicide layer by performing a silicidation step by using the amorphous region formed in the present embodiment.

Embodiment 7

A description will be given to a seventh embodiment related to a silicidation step using each of the embodiments described above.

The present embodiment initially forms, by using any of the embodiments described above, a wafer having a semiconductor region in which the boundary between an amorphous region and a crystal region is distinct and the interface therebetween presents reduced roughness. Then, a refractory metal film (such as a titanium film, a cobalt film, or a nickel film) is deposited on a substrate. Thereafter, laser annealing is performed by irradiating a top surface of the substrate with a laser beam. During the process, a reaction proceeds between the refractory metal film and the amorphous region to form a silicide layer.

Figure 17:
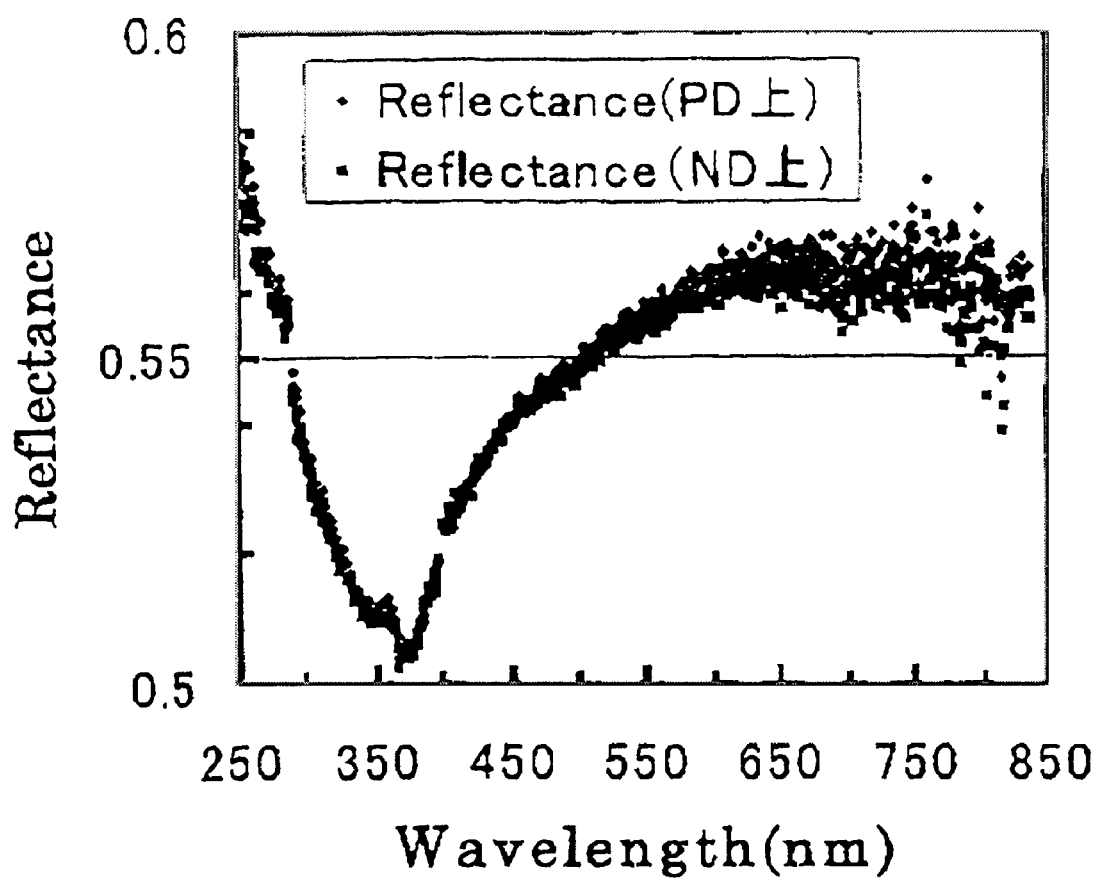
FIG. 17 shows a reflectance spectrum from a titanium silicide layer formed on the N-type and P-type diffusion layers of a wafer formed in a seventh embodiment of the present invention.

FIG. 17 shows reflectance spectra from a titanium silicide layer formed on the N-type and P-type diffusion layers of a wafer formed in the present embodiment. The titanium silicide layer was formed by laser annealing performed at a temperature of 450° C. or less. In the drawing, the horizontal axis represents the wavelength (nm) of measured light and the vertical axis represent reflectance, while PD indicates a heavily doped P-type diffusion layer (source/drain regions) and ND indicates a heavily doped N-type diffusion layer. Since the reflectances from the two diffusion layers are nearly coincident with each other over a wide range as shown in the drawing, the titanium silicide layer is assumed to have excellent smoothness.

Thus, the present embodiment has performed silicidation by using the wafer in which a distinct boundary has been provided in advance between the amorphous region and the crystal region and the interface therebetween has reduced roughness. In the case of performing silicidation by laser annealing, only the amorphous region having a low melting temperature melts and the underlying crystal region does not melt. This ensures selective silicidation of only the amorphous region, thereby allowing the formation of a silicidation with satisfactory smoothness: The silicide layer with satisfactory smoothness suppresses the occurrence of agglomeration and a junction leakage.

Other Embodiments

In the case of performing temperature measurement by using ion implantation according to any of the embodiments, two temperature measurements can be performed with the use of one sample by performing ion implantations from both sides of the wafer to form an amorphous region not only in the top surface of the wafer but also in the back surface thereof. If the annealing step is performed by irradiating the top surface of the wafer with a laser beam, the first temperature measurement can be performed by performing the annealing under such conditions that only the amorphous region in the top surface is reordered and the amorphous region in the back surface is not reordered. However, since the amorphous region in the back surface has not reordered yet, the temperature can be determined by performing annealing in another temperature range (particularly in a high temperature range). There may be cases where the temperature of the amorphous region in the back surface remains considerably low compared with the temperature of the amorphous region in the top surface if the wafer has a large diameter and an increased thickness. In those cases, it is highly probable that only the amorphous region in the top surface has reordered and the amorphous region in the back surface has not reordered yet even if the amorphous regions in the top and back surfaces were formed by ion implantations which were performed under the same conditions using the same ion species. To prevent this, it is also possible to initially perform the first temperature measurement by laser annealing, turn upside down the wafer having the reordered amorphous region in the top surface, performing annealing by irradiating the back surface facing upward with a laser beam, and then perform the subsequent temperature measurement.

In the case of performing temperature measurement by using ion implantation according to any of the embodiments, the heat conductivity of the wafer can be determined by performing ion implantations from both sides of the wafer and forming an amorphous region not only in the top surface of the wafer but in the back surface thereof. Specifically, if the annealing process is performed by irradiating the top surface of the wafer with a laser beam, the temperature difference between a region adjacent the top surface and a region adjacent the back surface can be detected by determining the respective reordering rates of the amorphous regions in the top and back surfaces. In the case of performing, e.g., a flash anneal, therefore, the heat conductivity of the wafer can be determined based on the temperature difference and time-varying temperatures. This allows strict control of temperatures in the individual steps. Although the thickness of a wafer is increased as the diameter thereof is increased, a semiconductor device with a particularly high production yield and a particularly high quality can be fabricated since the relationship between the thickness of the wafer and the temperature difference between the top and back surfaces of the wafer can be determined.

Each of the methods of measuring temperatures according to the foregoing embodiments may be performed by using a sample wafer for temperature measurement, by providing a monitor region in a wafer, or by using an actual wafer for forming a product device.

It is also possible to record each of the methods of measuring temperatures according to the foregoing embodiments on a recording medium using a magnetic, optical, or electric property and use the recording medium in the process of fabricating a semiconductor device.

What is claimed is:

1. A method of measuring a temperature, the method comprising the steps of:
    (a) doping an amorphous region formed in a semiconductor region of a substrate with oxygen;
    (b) heating the amorphous region for a given time and determining a reordering rate at which the amorphous region is recrystallized, wherein the reordering rate is the thickness of the amorphous region per unit time; and
    (c) determining a temperature of the amorphous region in the stop (b) based on a relationship between the reordering rate of the amorphous region and a heating temperature, which has been prepared in advance.

2. The method of claim 1, wherein the step (a) includes doping the amorphous region with oxygen such that a concentration of oxygen reaches a critical value for holding the reordering rate in the step (b) nearly constant from the initiation of the heating.

3. The method of claim 2, wherein the critical value is $3.2 \times 10^{19}$ atoms·cm$^{-3}$.

4. The method of claim 1, wherein an oxide film is formed on the semiconductor region of the substrate before the step (a) is performed, the method further comprising the step of
    forming, prior to the step (a), the amorphous region by implanting impurity ions into the semiconductor region.

5. The method of claim 1, further comprising the step of
    removing, prior to the process performed in the step (a), a natural oxide film on the semiconductor region therefrom under a reduced pressure, wherein
    the step (a) is performed without exposing the substrate to an atmosphere and by holding the substrate under a reduced pressure after the step of removing the natural oxide film.

6. The method of claim 1, wherein the step (b) is performed by using spectro ellipsometric measurement of a thickness of the amorphous region.

7. A method of measuring a temperature, the method comprising the steps of:
    (a) forming an amorphous region in a semiconductor region of a substrate by implanting therein ions of a IV group element;
    (b) heating the amorphous region for a given time and determining a reordering rate at which the amorphous region is recrystallized, wherein the reordering rate is the thickness of the amorphous region per unit time; and
    (c) determining a temperature of the amorphous region in the step (b) based on a relationship between the reordering rate of the amorphous region and a heating temperature, which has been prepared in advance.

8. The method of claim 7, wherein the step (a) includes implanting Ge ions under such a condition that a dose is $1 \times 10^{15}$ atoms·cm$^{-2}$ or more.

9. A method of measuring a temperature, the method comprising the steps of:
    (a) forming an amorphous region in a semiconductor region of a substrate by implanting therein ions of at least one of arsenic (As), phosphorus (P), a halogen element, and an inert gas element;
    (b) heating the amorphous region for a given time and determining a reordering rate at which the amorphous region is recrystallized, wherein the reordering rate is the thickness of the amorphous region per unit time; and
    (c) determining a temperature of the amorphous region in the step (b) based on a relationship between the reordering rate of the amorphous region and a heating temperature, which has been prepared in advance.

10. A method of measuring a temperate, the method comprising the steps of:

(a) forming a plurality of amorphous regions in a plurality of portions of a semiconductor region of a substrate by implanting ions therein under different conditions;

(b) heating the plurality of amorphous regions for a given time and individually determining respective reordering rates at which the amorphous regions a recrystallized, wherein the reordering rate is the thickness of the amorphous region per unit time; and (c) determining respective temperatures of the amorphous regions in the step (b) which correspond to the individual reordering rates based on relationships between the respective reordering rates of the amorphous regions and a heating temperature, which have been prepared in advance.

11. The method of claim 10, wherein the step (a) includes implanting different ion species into the plurality of portions or implanting the ions into the plurality of portions under different conditions.

12. The method of claim 10, wherein
the substrate is in the form of a wafer and
the step (a) is performed by using a sample having the plurality of portions composed of four regions formed by vertically and horizontally dividing the wafer into four parts in two dimensions.

13. A method of measuring a temperature, the method comprising the steps of:

(a) forming a first amorphous region in a first semiconductor region located in a top surface of a substrate by implanting ions therein;

(b) forming a second amorphous region in a second semiconductor region located in a back surface of the substrate by implanting ions therein;

(c) heating the substrate under such conditions that the first amorphous region is reordered and the second amorphous region is not reordered and determining a reordering rate of the first amorphous region, wherein the reordering rate is the thickness of the amorphous region per unit time; and (d) determining a temperature of either one of the first and second amorphous regions in the step (c) based on a relationship between the reordering rate of the first amorphous region and a heating temperature, which has been prepared in advance.

14. A method of measuring a temperature, the method comprising the steps of:

(a) forming a first amorphous region in a first semiconductor region located in a top surface of a substrate by implanting ions therein;

(b) forming a second amorphous region in a second semiconductor region located in a back surface of the substrate by implanting ions therein;

(c) heating the substrate to reorder the first and second amorphous regions and determining respective reordering rates of the first and second amorphous regions;

(d) determining respective temperatures of the first and second amorphous regions in the step (c) which correspond to the individual reordering rates based on relationships between the respective reordering rates of the first and second amorphous regions and a heating temperature, which have been prepared in advance; and (e) determining a heat conductivity of the substrate based on a temperature difference between the first and second amorphous regions.

15. A method of measuring a temperature, the method comprising the steps of:

(a) for an amorphous region in a semiconductor region of a substrate by implanting ions therein under such a condition that a temperature of the substrate is lower than −10° C.;

(b) heating the amorphous region for a given time and determining a reordering rate at which the amorphous region is recrystallized, wherein the reordering rate is the thickness of the amorphous region per unit time; and (c) determining a temperature of the amorphous region in the step (b) based on a relationship between the reordering rate of the amorphous region and a heating temperature, which has been prepared in advance.

16. A method of measuring a temperature, the method comprising the steps of:

(a) forming an amorphous region in a semiconductor region of a substrate by implanting ions therein;

(b) annealing the amorphous region at a temperature in the range of 300 to 450° C.;

(c) heating the amorphous region and determining a reordering rate at which the amorphous region is recrystallized, wherein the reordering rate is the thickness of the amorphous region per unit time; and (d) determining a temperature of the amorphous region in the step (c) based on a relationship between the reordering rate of the amorphous region and a heating temperature, which has been prepared in advance.

17. A method of producing a sample for temperature measurement performed by heating an amorphous region of a substrate for a given time, determining a reordering rate at which the amorphous region is recrystallized, wherein the reordering rate is the thickness of the amorphous region per unit time, and thereby measuring a temperature of the amorphous region during the heating based on a relationship between the reordering rate of the amorphous region and a heating temperature, which has been prepared in advance, wherein
the amorphous region formed in a semiconductor region of the substrate is doped with oxygen at a critical concentration for holding the reordering rate during the heating nearly constant from the initiation of the heating.

18. The method of claim 17, wherein the critical concentration is $3.2 \times 10^{19}$ atoms·cm$^{-3}$.

19. The method of claim 17, wherein
an oxide film is formed on the semiconductor region of the substrate prior to the doping of the amorphous region with oxygen and
the amorphous region is formed by implanting impurity ions into the semiconductor region from over the oxide film prior to the doping of the amorphous region with oxygen.

20. The method of claim 17, wherein, prior to the doping of the amorphous region with oxygen, a natural oxide film on the semiconductor region is removed therefrom under a reduced pressure and then the semiconductor region is doped with oxygen ions implanted therein.

21. A method of producing a sample for temperature measurement performed by heating an amorphous region of a substrate for a given time, determining a reordering rate at which the amorphous region is recrystallized, wherein the reordering rate is the thickness of the amorphous region per unit time, and thereby measuring a temperature of the amorphous region during the heating based on a relationship between the reordering rate of the amorphous region and a heating temperature, which has been prepared in advance, wherein the amorphous region is formed in a semiconductor region of the substrate by implanting therein ions of a IV group element.

22. The method of claim 21, wherein, during the ion implantation, Ge ions are implanted under such a condition that a dose is $1 \times 10^{15}$ atoms·cm$^{-2}$ or more.

23. A method of producing a sample for temperature measurement performed by heating an amorphous region of a substrate for a given time, determining a reordering rate at which the amorphous region is recrystallized, wherein the reordering rate is the thickness of the amorphous region per unit time, and thereby measuring a temperature of the amorphous region during the heating based on a relationship between the reordering rate of the amorphous region and a heating temperature, which has been prepared in advance, wherein the amorphous region is formed in a semiconductor region of the substrate by implanting therein ions of at least one of arsenic (As), phosphorus (P), a halogen element, and an inert gas element.

24. A method of producing a sample for temperature measurement performed by heating an amorphous region of a substrate for a given time, determining a reordering rate at which the amorphous region is recrystallized, wherein the reordering rate is the thickness of the amorphous region per unit time, and thereby measuring a temperature of the amorphous region during the heating based on a relationship between the reordering rate of the amorphous region and a heating temperature, which has been prepared in advance, wherein a plurality of amorphous regions are formed in a plurality of portions of a semiconductor region of the substrate by implanting ions therein under different conditions.

25. The method of claim 24, wherein, during the ion implantation, different ion species are implanted into the plurality of portions or the ions are implanted into the plurality of portions under different conditions.

26. The method of claim 24, wherein
the substrate is in the form of a wafer and
the four portions are composed of plurality of regions formed by vertically and horizontally dividing the wafer into four parts in two dimensions.

27. A method of producing a sample for temperature measurement performed by heating an amorphous region of a substrate for a given time, determining a reordering rate at which the amorphous region is recrystallized, wherein the reordering rate is the thickness of the amorphous region per unit time, and thereby measuring a temperature of the amorphous region during the heating based on a relationship between the reordering rate of the amorphous region and a heating temperature, which has been prepared in advance, the method comprising the steps of:

(a) forming a first amorphous region in a first semiconductor region located in a top surface of the substrate by implanting ions therein; and (b) forming a second amorphous region in a second semiconductor region located in a back surface of the substrate by implanting ions therein.

28. A method of producing a sample for temperature measurement performed by heating an amorphous region of a substrate for a given time, determining a reordering rate at which the amorphous region is recrystallized, and thereby measuring a temperature of the amorphous region during the heating based on a relationship between the reordering rate of the amorphous region and a heating temperature, which has been prepared in advance, the method comprising the steps of:

(a) forming a first amorphous region in a first semiconductor region located in a top surface of the substrate by implanting ions therein; and (b) forming a second amorphous region in a second semiconductor region located in a back surface of the substrate by implanting ions therein, wherein when respective temperatures of the first and second amorphous regions are measured, a sample which allows a heat conductivity of the substrate to be determined based on a temperature difference between the first and second amorphous regions is formed.

29. A method of producing a sample for temperature measurement performed by heating an amorphous region of a substrate for a given time, determining a reordering rate at which the amorphous region is recrystallized, wherein the reordering rate is the thickness of the amorphous region per unit time, and thereby measuring a temperature of the amorphous region during the heating based on a relationship between the reordering rate of the amorphous region and a heating temperature, which has been prepared in advance, wherein the amorphous region is formed in a semiconductor region of the substrate by implanting ions therein under such a condition that a temperature of the substrate is lower than $-10°$ C.

30. A method of producing a sample for temperature measurement performed by heating an amorphous region of a substrate for a given time, determining a reordering rate at which the amorphous region is recrystallized, wherein the reordering rate is the thickness of the amorphous region per unit time, and thereby measuring a temperature of the amorphous region during the heating based on a relationship between the reordering rate of the amorphous region and a heating temperature, which has been prepared in advance the method comprising the steps of:

(a) forming the amorphous region in a semiconductor region of the substrate by implanting ions therein; and (b) annealing the amorphous region at a temperature in the range of 300 to 450° C.

31. A method for fabricating a semiconductor device in a semiconductor region of a substrate, the method comprising a preamorphous step of forming an amorphous region in the semiconductor region by implanting ions therein under such a condition that a temperature of the substrate is lower than $-10°$ C., wherein after the preamorphous step, at least one of the step of implanting boron ions into the amorphous region and the step of siliciding the amorphous region is performed.

32. The method of claim 31, wherein the preamorphous step, ions of Ge$^{33}$ having Ge isotope or ions of the IV group element having a mass larger than Ge are used as the principal ions for implantation.

33. The method of claim 31 wherein ions are implanted at a dose of $3 \times 10^{14}$ atoms·cm$^{-2}$ or less.

34. A method for fabricating a semiconductor device in a semiconductor region of a substrate, the method comprising a preamorphous step of forming an amorphous region in the semiconductor region by implanting ions therein and annealing the amorphous region at a temperature in the range of 300 to 450° C., wherein after the preamorphous step, at least one of the step of implanting boron ions into the amorphous region and the step of siliciding the amorphous region is performed.

35. The method of claim 34, wherein in the preamorphous step, ions of Ge$^{33}$ having Ge isotope or ions of the IV group element having a mass larger than Ge are used as the principal ions for implantation.

36. The method of claim 34 wherein ions are implanted at a dose of $3\times10^{14}$ atoms·cm$^{-2}$ or less.

37. A method for fabricating a semiconductor device in a semiconductor region of a substrate, the method comprising the steps of:

forming a first amorphous region in a first semiconductor region located in a top surface of the substrate by implanting ions therein and forming a second amorphous region in a second semiconductor region located in a back surface of the substrate by implanting ions therein; and determining, in a process of heating the first and second amorphous regions, respective temperatures of the first and second amorphous regions based on respective reordering rates of the first and second amorphous regions, determining a heat conductivity of the substrate based on a temperature difference between the first and second amorphous regions, and controlling the respective temperatures of the first and second amorphous regions of the substrate.

* * * * *